(12) United States Patent
Elsherbini et al.

(10) Patent No.: US 12,113,048 B2
(45) Date of Patent: Oct. 8, 2024

(54) MICROELECTRONIC ASSEMBLIES

(71) Applicant: Intel Corporation, Santa Clara, CA (US)

(72) Inventors: Adel A. Elsherbini, Tempe, AZ (US); Feras Eid, Chandler, AZ (US); Johanna M. Swan, Scottsdale, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/090,801

(22) Filed: Dec. 29, 2022

(65) Prior Publication Data

US 2023/0133235 A1 May 4, 2023

Related U.S. Application Data

(63) Continuation of application No. 17/129,221, filed on Dec. 21, 2020, now Pat. No. 11,616,047, which is a
(Continued)

(51) Int. Cl.
*H01L 25/065* (2023.01)
*H01L 23/00* (2006.01)
(Continued)

(52) U.S. Cl.
CPC .......... *H01L 25/0652* (2013.01); *H01L 24/17* (2013.01); *H01L 24/24* (2013.01);
(Continued)

(58) Field of Classification Search
None
See application file for complete search history.

(56) References Cited

U.S. PATENT DOCUMENTS 7,402,901 B2   7/2008  Hatano
8,335,084 B2   12/2012 Lee
(Continued)

FOREIGN PATENT DOCUMENTS

CN      102439719 A     5/2012
JP      2004165234      6/2004
(Continued)

OTHER PUBLICATIONS

Office Action for Korean Patent Application No. 10-2022-7046430 mailed Jan. 25, 2023, 9 pgs.
(Continued)

*Primary Examiner* — Long Pham
(74) *Attorney, Agent, or Firm* — Schwabe, Williamson & Wyatt P.C.

(57) ABSTRACT

Microelectronic assemblies, related devices and methods, are disclosed herein. In some embodiments, a microelectronic assembly may include a package substrate having a first surface and an opposing second surface; a first die having a first surface and an opposing second surface embedded in a first dielectric layer, where the first surface of the first die is coupled to the second surface of the package substrate by first interconnects; a second die having a first surface and an opposing second surface embedded in a second dielectric layer, where the first surface of the second die is coupled to the second surface of the first die by second interconnects; and a third die having a first surface and an opposing second surface embedded in a third dielectric layer, where the first surface of the third die is coupled to the second surface of the second die by third interconnects.

13 Claims, 15 Drawing Sheets

Related U.S. Application Data continuation of application No. 16/008,879, filed on Jun. 14, 2018, now Pat. No. 11,469,206.

(51) Int. Cl.
*H01L 25/00* (2006.01)
*H01L 25/18* (2023.01)

(52) U.S. Cl.
CPC .............. *H01L 25/18* (2013.01); *H01L 25/50* (2013.01); *H01L 2224/1703* (2013.01); *H01L 2224/17135* (2013.01); *H01L 2224/17136* (2013.01); *H01L 2224/17177* (2013.01); *H01L 2224/17181* (2013.01); *H01L 2224/24146* (2013.01); *H01L 2224/73259* (2013.01); *H01L 2225/06513* (2013.01); *H01L 2225/06517* (2013.01); *H01L 2225/06544* (2013.01); *H01L 2225/06548* (2013.01)

(56) References Cited

U.S. PATENT DOCUMENTS

| | | | |
|---|---|---|---|
| 8,716,859 | B2 | 5/2014 | Meyer |
| 10,096,574 | B2 | 10/2018 | Tsukiyama |
| 10,283,434 | B2 | 5/2019 | Sakai |
| 10,283,453 | B2 | 5/2019 | Qian |
| 10,340,206 | B2 | 7/2019 | Yu |
| 10,811,394 | B2 * | 10/2020 | Yu ........................ H01L 23/3114 |
| 11,348,895 | B2 | 5/2022 | Liff |
| 11,469,206 | B2 | 10/2022 | Elsherbini |
| 2010/0290191 | A1 | 11/2010 | Lin et al. |
| 2011/0278741 | A1 | 11/2011 | Chua |
| 2012/0248439 | A1 * | 10/2012 | Lee ................... H01L 23/49838 257/777 |
| 2013/0075903 | A1 | 3/2013 | Pagaila |
| 2014/0106508 | A1 | 4/2014 | Sutardja et al. |
| 2015/0216030 | A1 | 7/2015 | Semmelmeyer |
| 2015/0255427 | A1 | 9/2015 | Sung |
| 2015/0315071 | A1 | 11/2015 | Amos |
| 2016/0155723 | A1 | 6/2016 | Lou |
| 2016/0315071 | A1 | 10/2016 | Zhai |
| 2017/0084576 | A1 * | 3/2017 | Yu ............................ H01L 21/56 |
| 2017/0110407 | A1 | 4/2017 | Chaware |
| 2017/0141088 | A1 * | 5/2017 | Zhai ....................... H01L 21/561 |
| 2017/0365587 | A1 | 12/2017 | Hung |
| 2022/0051987 | A1 | 2/2022 | Elsherbini |

FOREIGN PATENT DOCUMENTS

| | | |
|---|---|---|
| JP | 2007287803 | 11/2007 |
| JP | 2012527127 | 11/2012 |
| JP | 2015-507360 | 3/2015 |
| JP | 2016063017 | 4/2016 |
| JP | 2016063218 | 4/2016 |
| JP | 2017092094 | 5/2017 |
| JP | 2017183714 | 10/2017 |
| JP | 2018-514088 | 5/2018 |
| JP | 2021-256309 | 9/2021 |
| KR | 1020160001912 | 1/2016 |
| TW | 201721781 | 6/2017 |
| TW | 201816897 | 5/2018 |
| WO | WO-2017052653 | 3/2017 |

OTHER PUBLICATIONS

Office Action for Taiwan Patent Application No. 108115558 mailed Jan. 9, 2023, 9 pgs.
Office Action for Japan Patent Application No. 2020-545627 mailed Feb. 7, 2023, 3 pgs.
Office Action for Korean Patent Application No. 10-2020-7025378 mailed Dec. 28, 2022, 4 pgs., with English summary.
Search Report in European Patent Application No. 22217283.5 mailed Aug. 29, 2023, 13 pages.
Notice of Allowance in Korean Patent Application No. 10-2022-7046430 dated Jul. 20, 2023, 5 pgs.
Notice of Allowance for Korean Patent Application No. 10-2020-7025378 mailed Apr. 5, 2023, 5 pgs.
Notice of Allowance for Japan Patent Application No. 2020-545627 mailed Apr. 18, 2023, 3 pgs.
International Search Report and Written Opinion for International Application No. PCT/US2019/032159 mailed Aug. 23, 2019, 12 pages.
Walton, Mark, "HBM Explained: Can stacked memory give AMO the edge it needs?", Biz & It, retrieved on Dec. 21, 2020, https://arstechnica.com/information-technology/2015/05/the-tech-behind-hbm-why-amds-high-pandwidth-memory-matters/, 5 pages.
International Preliminary Report on Patentability for International Application No. PCT/US2019/032159 mailed Dec. 24, 2020, 9 pages.
Extended European Search Report in European Patent Application No. 19819772.5 mailed Feb. 10, 2022, 11 pages.
Notice of Preliminary Rejection in Korean Patent Application No. 10-2020-7025378 dated Jun. 9, 2022, 7 pages including summary of relevance.
Office Action for Japan Patent Application No. 2020-545627 mailed Feb. 25, 2022, 5 pgs., with English translation.
Final Office Action for Japan Patent Application No. 2020-545627 mailed Sep. 13, 2022, 7 pgs., with English translation.
Notice of Allowance for Taiwan Patent Application No. 108115558 mailed Oct. 2, 2023, 3 pgs.
Office Action for Taiwan Patent Application No. 111150497 mailed Nov. 10, 2023, 6 pgs.
Office Action for Korean Patent Application No. 10-2023-7036277, mailed Dec. 12, 2023, 3 pgs.
Office Action for Japan Patent Application No. 2023-059898 mailed May 14, 2024, 7 pgs.
Notice of Allowance for Taiwan Patent Application No. 111150597 mailed Mar. 13, 2024, 3 pgs.
Office Action for Korean Patent Application No. 10-2023-7036277, mailed Jul. 1, 2024, 3 pgs.

* cited by examiner

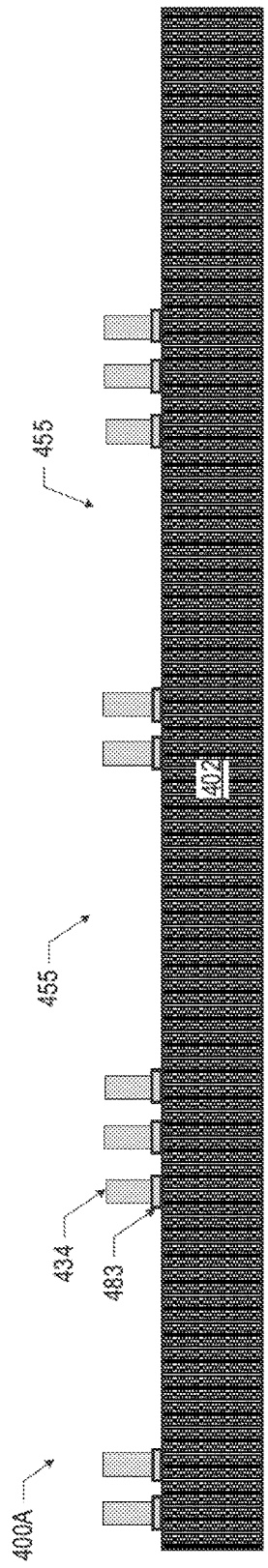
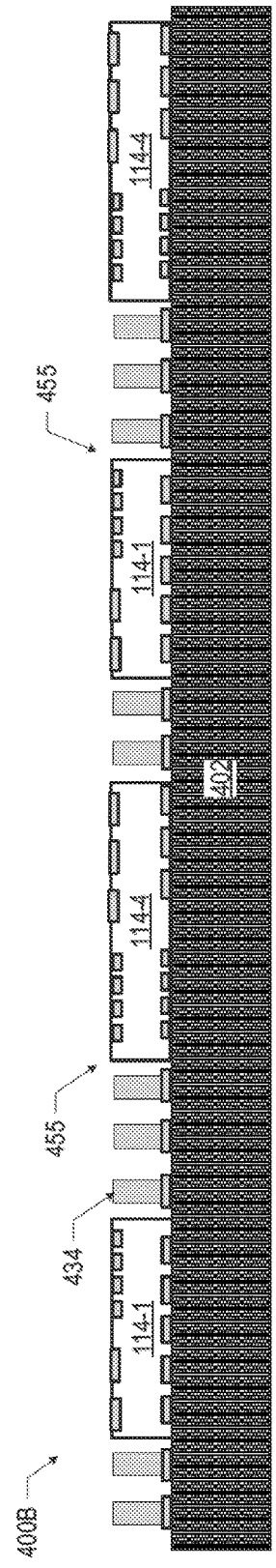
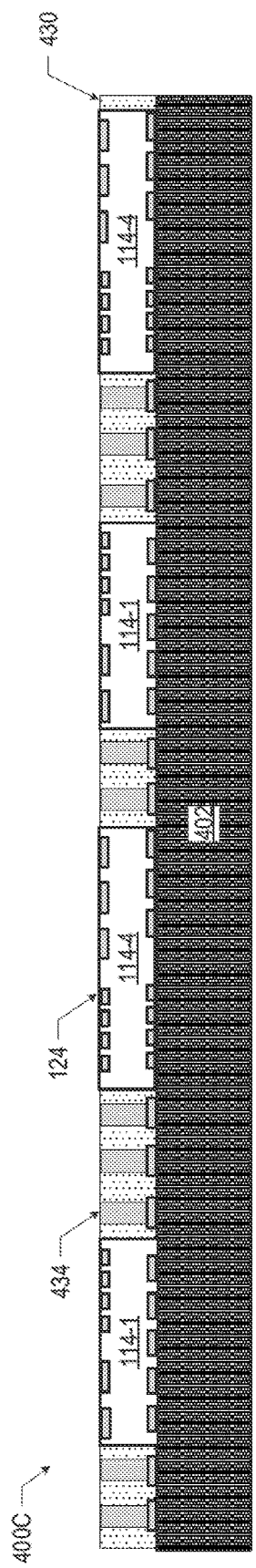
FIG. 4A
FIG. 4B
FIG. 4C

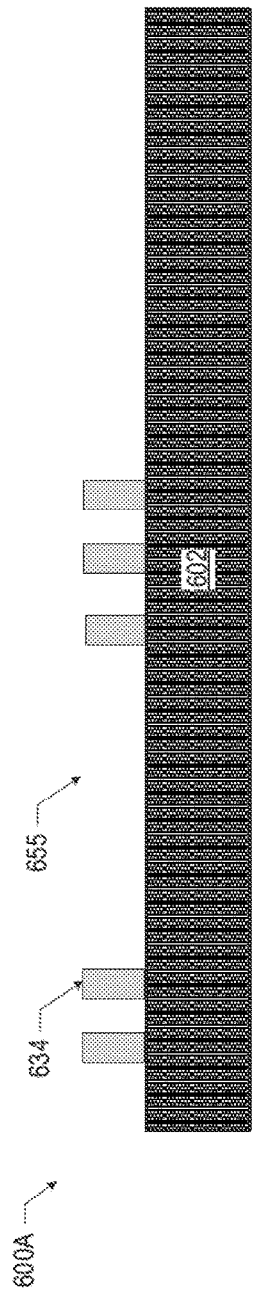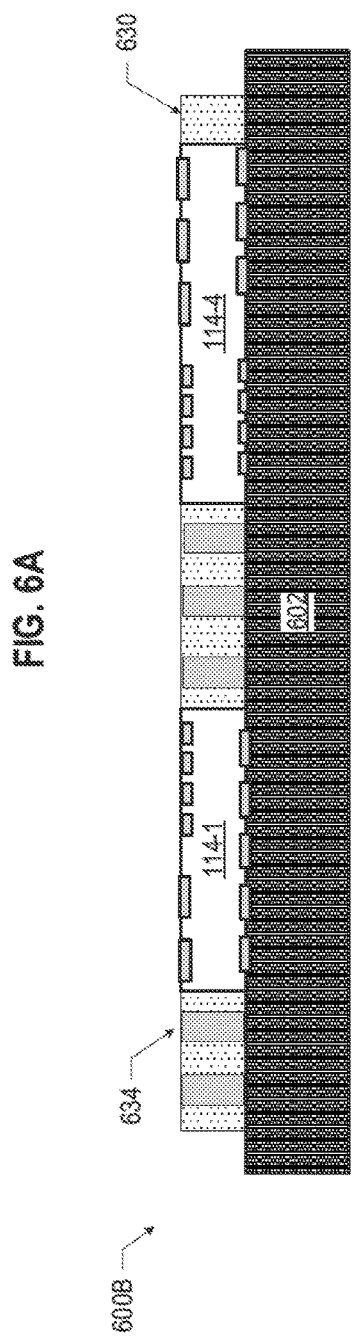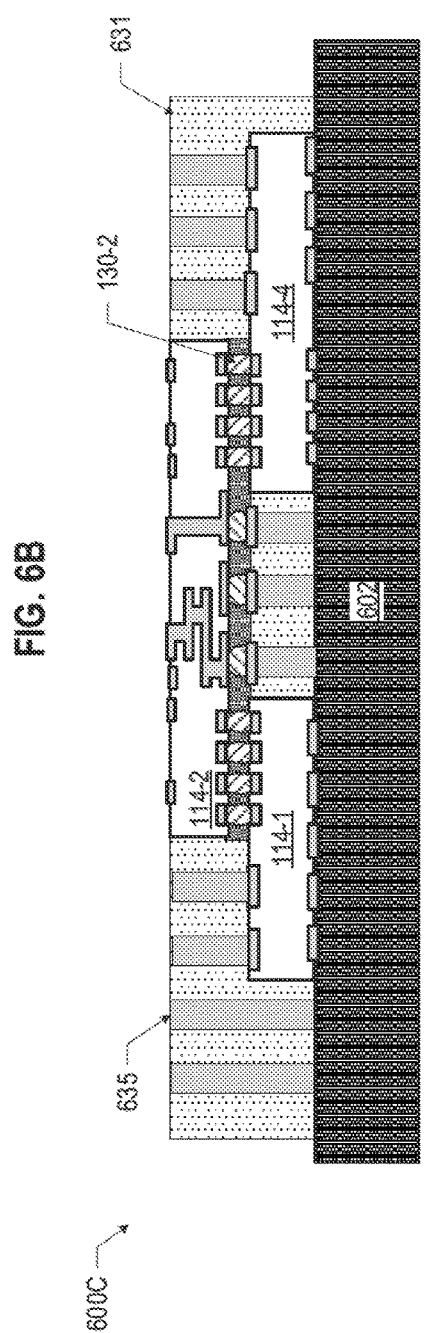

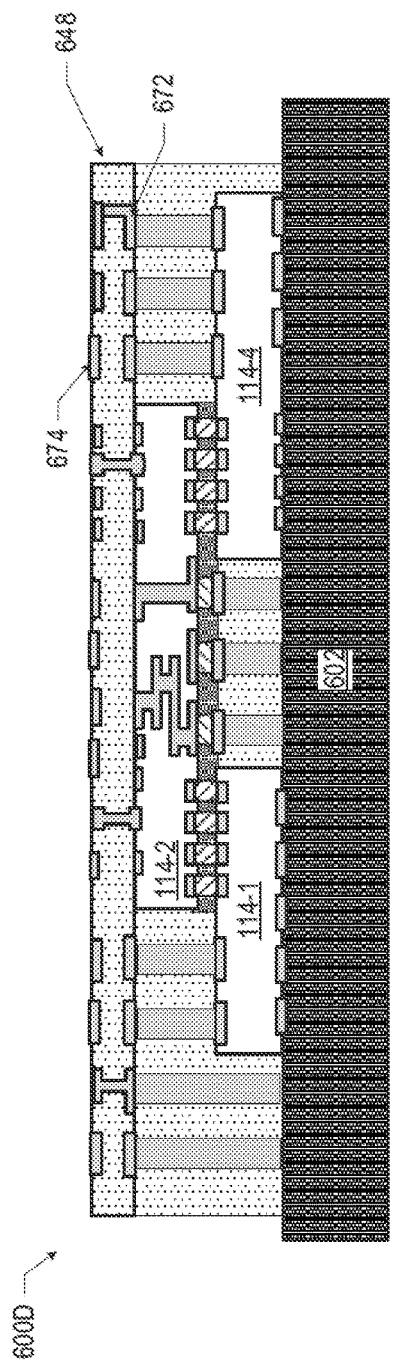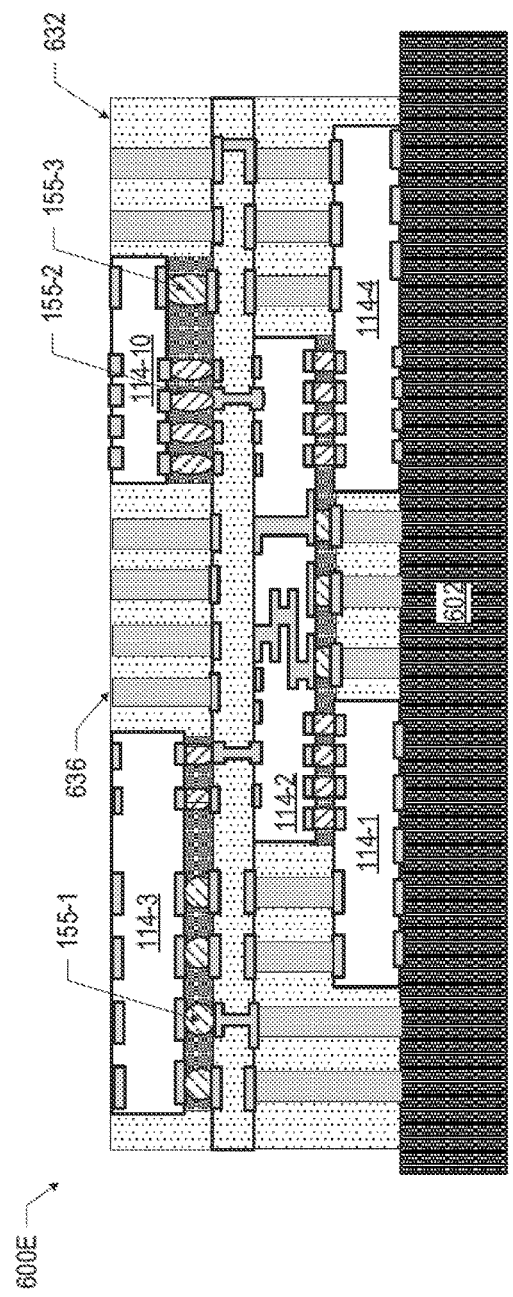

MICROELECTRONIC ASSEMBLIES

CROSS-REFERENCE TO RELATED APPLICATIONS

This application is a continuation of U.S. patent application Ser. No. 17/129,221, filed Dec. 21, 2020, which is a continuation of U.S. patent application Ser. No. 16/008,879, filed on Jun. 14, 2018, now U.S. Pat. No. 11,469,206, issued Oct. 11, 2022, the entire contents of which are hereby incorporated by reference herein.

BACKGROUND

Integrated circuit (IC) dies are conventionally coupled to a package substrate for mechanical stability and to facilitate connection to other components, such as circuit boards. The interconnect pitch achievable by conventional substrates is constrained by manufacturing, materials, and thermal considerations, among others.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 4A-4I are side, cross-sectional views of various stages in an example process for manufacturing the microelectronic assembly of FIG. 3, in accordance with various embodiments.

FIGS. 6A-6F are side, cross-sectional views of various stages in an example process for manufacturing the microelectronic assembly of FIG. 5, in accordance with various embodiments.

DETAILED DESCRIPTION

Figure 1A:
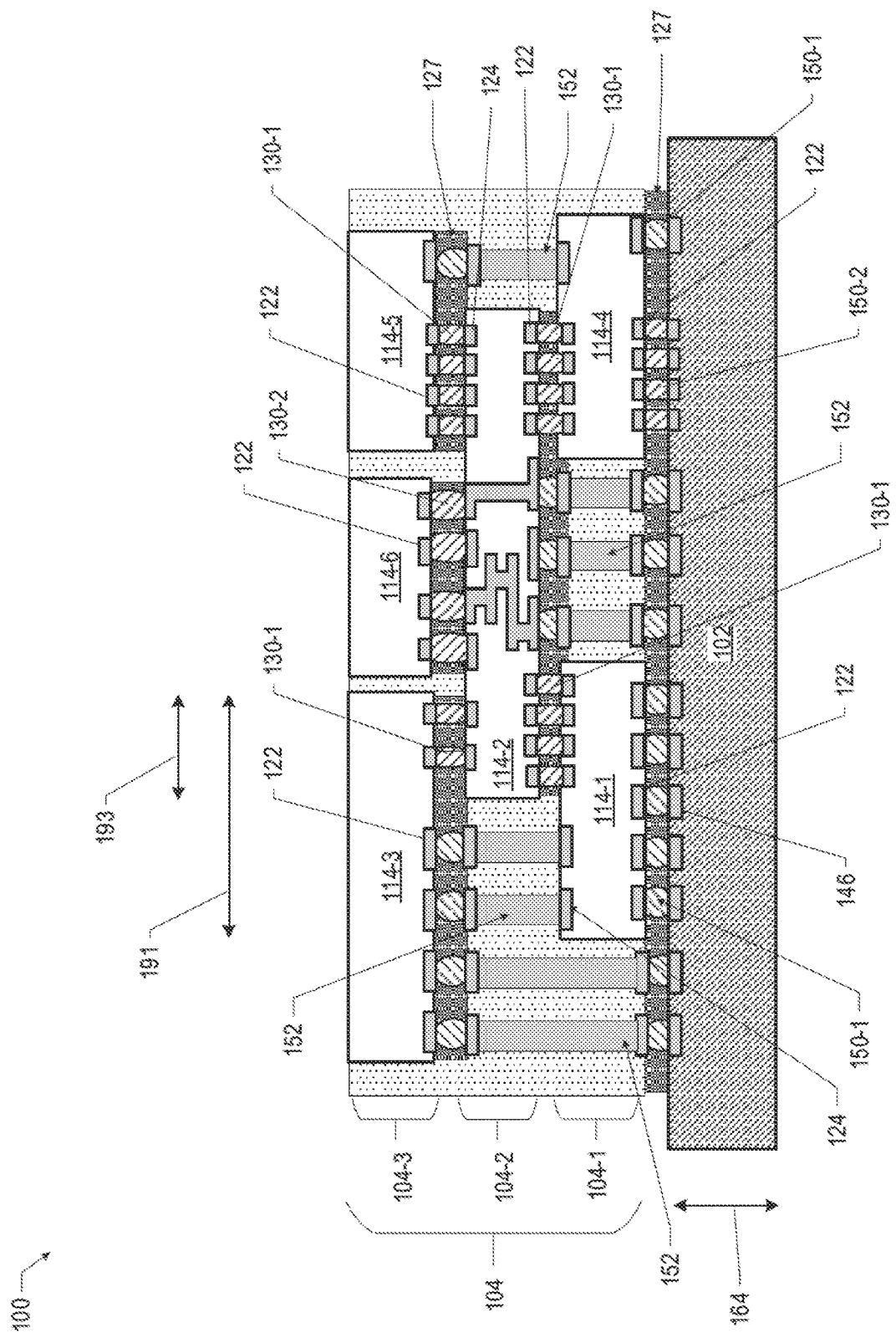
FIG. 1A is a side, cross-sectional view of an example microelectronic assembly, in accordance with various embodiments.

Microelectronic assemblies, and related devices and methods, are disclosed herein. For example, in some embodiments, a microelectronic assembly may include a package substrate having a first surface and an opposing second surface, a first die having a first surface and an opposing second surface, wherein the first die is embedded in a first dielectric layer and wherein the first surface of the first die is coupled to the second surface of the package substrate by first interconnects, a second die having a first surface and an opposing second surface, wherein the second die is embedded in a second dielectric layer and wherein the first surface of the second die is coupled to the second surface of the first die by second interconnects, and a third die having a first surface and an opposing second surface, wherein the third die is embedded in a third dielectric layer and wherein the first surface of the third die is coupled to the second surface of the second die by third interconnects.

Communicating large numbers of signals between two or more dies in a multi-die IC package is challenging due to the increasingly small size of such dies, thermal constraints, and power delivery constraints, among others. Various ones of the embodiments disclosed herein may help achieve reliable attachment of multiple IC dies at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified.

When used to describe a range of dimensions, the phrase "between X and Y" represents a range that includes X and Y. For convenience, the phrase "FIG. 4" may be used to refer to the collection of drawings of FIGS. 4A-4I, the phrase "FIG. 6" may be used to refer to the collection of drawings of FIGS. 6A-6F, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1A is a side, cross-sectional view of a microelectronic assembly 100, in accordance with various embodiments. The microelectronic assembly 100 may include a package substrate 102 coupled to a multi-layer die subassembly 104 having multi-level interconnects. As used herein, the term a "multi-layer die subassembly" may refer to a composite die having three or more stacked dielectric layers with one or more dies embedded in each layer, and conductive interconnects and/or conductive pathways connecting the one or more dies, including dies in non-adjacent layers. As used herein, the terms a "multi-layer die subassembly" and a "composite die" may be used interchangeably. As used herein, the term "multi-level interconnect" may refer to an interconnect between a first component and a second component where the first component and the second component are not in adjacent layers, or may refer to an interconnect that spans one or more layers (e.g., an interconnect between a first die in a first layer and a second die in a third layer, or an interconnect between a package substrate and a die in a second layer). As shown in FIG. 1A, the multi-layer die subassembly 104 may include three layers. In particular, the multi-layer die subassembly 104 may include a first layer 104-1 having a die 114-1 and a die 114-4, a second layer 104-2 having a die 114-2, and a third layer 104-3 having a die 114-3, a die 114-5, and a die 114-6. The die 114-1 in the first layer 104-1 may be coupled to the package substrate 102 by die-to-package substrate (DTPS) interconnects 150-1, may be coupled to the die 114-2 in the second layer 104-2 by die-to-die (DTD) interconnects 130-1, and may be coupled to the die 114-3 in the third layer 104-3 by multi-level (ML) interconnects 152. The top surface of the package substrate 102 may include a set of conductive contacts 146. The dies 114-1, 114-2 and 114-4 may include a set of conductive contacts 122 on the bottom surface of the die, and a set of conductive contacts 124 on the top surface of the die. The dies 114-3, 114-5, 114-6 may include a set of conductive contacts 122 on the bottom surface of the die. As shown for the die 114-1, the conductive contacts 122 at the bottom surface of the die 114-1 may be electrically and mechanically coupled to the conductive contacts 146 at the top surface of the package substrate 102 by the DTPS interconnects 150-1; the conductive contacts 124 on the top surface of the die 114-1 may be electrically and mechanically coupled to the conductive contacts 122 on the bottom surface of the die 114-2 by DTD interconnects 130-1, and further may be electrically and mechanically coupled to the conductive contacts 122 on the bottom surface of the die 114-3 by ML interconnects 152. As shown for the die 114-4, the conductive contacts 122 at the bottom surface of the die 114-4 may be electrically and mechanically coupled to the conductive contacts 146 at the top surface of the package substrate 102 by the DTPS interconnects 150-1; the conductive contacts 124 on the top surface of the die 114-4 may be electrically and mechanically coupled to the conductive contacts 122 on the bottom surface of the die 114-2 by DTD interconnects 130-1, and further may be electrically and mechanically coupled to the conductive contacts 122 on the bottom surface of the die 114-5 by ML interconnects 152. As shown for the die 114-2, the conductive contacts 122 on the bottom surface of the die 114-2 may be electrically and mechanically coupled to the conductive contacts 146 on the top surface of the package substrate 102 by ML interconnects 152, and may be electrically and mechanically coupled to the conductive contacts 124 on the top surface of the dies 114-1 and 114-4 by DTD interconnects 130-1; the conductive contacts 124 on the top surface of the die 114-2 may be electrically and mechanically coupled to the conductive contacts 122 on the bottom surface of the dies 114-3 and 114-5, and 114-6 by DTD interconnects 130-1 and 130-2, respectively. As shown for the die 114-3, the conductive contacts 122 on the bottom surface of the die 114-3 further may be electrically and mechanically coupled to the conductive contacts 124 on the top surface of the die 114-2 and to the conductive contacts 146 on the top surface of the package substrate by ML interconnects 152. As shown for the die 114-5, the conductive contacts 122 on the bottom surface of the die 114-5 further may be electrically and mechanically coupled to the conductive contacts 124 on the top surface of the die 114-4 by ML interconnect 152. As shown for the die 114-6, the conductive contacts 122 on the bottom surface of the die 114-6 may be electrically and mechanically coupled to the conductive contacts 124 on the top surface of the die 114-2 by DTD interconnects 130-2.

The ML interconnects 152 may be formed of any appropriate conductive material, such as copper, silver, nickel, gold, aluminum, or other metals or alloys, for example. The ML interconnects 152 may be formed using any suitable process, including, for example, the process described with reference to FIG. 4. In some embodiments, the ML interconnects 152 disclosed herein may have a pitch between 100 microns and 300 microns. The ML interconnects 152 may provide a more direct conductive pathway between one or more dies 114 of the multi-layer die subassembly 104, and/or one or more dies 114 and the package substrate 102. The more direct connections of the ML interconnections (i.e., shorter conductive pathways) may improve the performance of the microelectronic assembly by increasing bandwidth, by reducing resistance, by lowering parasitics, and/or by more efficiently delivering power from the package substrate 102 to the one or more dies 114.

Figure 5:
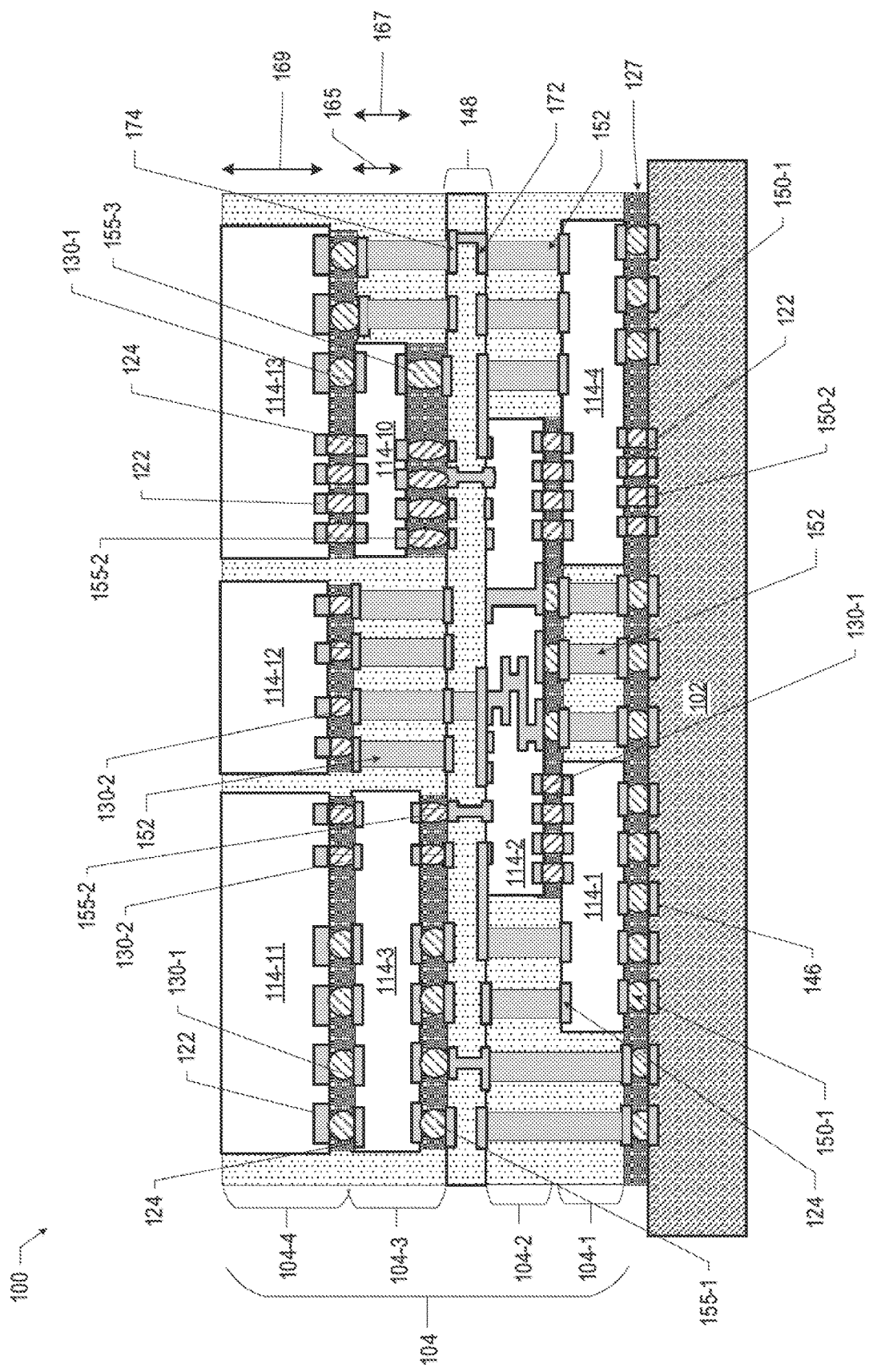
FIG. 5 is a side, cross-sectional view of an example microelectronic assembly, in accordance with various embodiments.

In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier (e.g., as shown in FIG. 5) by laminating or spinning on a dielectric material, and creating conductive vias and lines by laser drilling and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

In some embodiments, the package substrate 102 may be a lower density medium and the die 114 (e.g., the die 114-4) may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

As shown in FIG. 1A, the DTPS interconnects 150-1 of the die 114-1 may have a different pitch from the DTPS interconnects 150-2 of the die 114-4. In some embodiments, as shown on the die 114-4, the DTPS interconnects 150 may have a different pitch on the same die. For example, the DTPS interconnects 150-1 of the die 114-4 may have a different pitch from the DTPS interconnects 150-2 of the die 114-4. In another example, the die 114-2 on the top surface may have DTD interconnects 130-1 that may have a different pitch from the DTD interconnects 130-2 on the same surface. A die 114 that has interconnects 130 of different pitches at a same surface may be referred to as a mixed-pitch die 114. In some embodiments, the DTD interconnects may have a pitch between 5 microns and 200 microns (e.g., between 5 microns and 100 microns). In some embodiments, the DTPS interconnects may have a pitch between 200 microns and 800 microns (e.g., between 300 microns and 600 microns).

Although FIG. 1A shows the dies 114-1, 114-2, and 114-4 as double-sided dies and the dies 114-3, 114-5, and 114-6 as single-sided dies, the dies 114 may be a single-sided or a double-sided die and may be a single-pitch die or a mixed-pitch die. In some embodiments, additional components may be disposed on the top surface of the dies 114-3, 114-5, and/or 114-6. Additional passive components, such as surface-mount resistors, capacitors, and/or inductors, may be disposed on the top surface or the bottom surface of the package substrate 102, or embedded in the package substrate 102. In this context, a double-sided die refers to a die that has connections on both surfaces. In some embodiments, a double-sided die may include through silicon vias (TSVs) to form connections on both surfaces. The active surface of a double-sided die, which is the surface containing one or more active devices and a majority of interconnects, may face either direction depending on the design and electrical requirements.

Although FIG. 1A shows the dies 114 in a particular arrangement, the dies 114 may be in any suitable arrangement. For example, a die 114-3 from a third layer 104-3 may extend over a die 114-1 in a first layer 104-1 by an overlap distance 191, and may extend over a die 114-2 in a second layer 104-2 by an overlap distance 193. The overlap distances 191, 193 may be any suitable distance. In some embodiments, the overlap distance 191 may be between 0.5 millimeters and 50 millimeters (e.g., between 0.75 millimeters and 20 millimeters, or approximately 10 millimeters). In some embodiments, the overlap distance 193 may be between 0.25 millimeters and 5 millimeters.

Figure 1B:
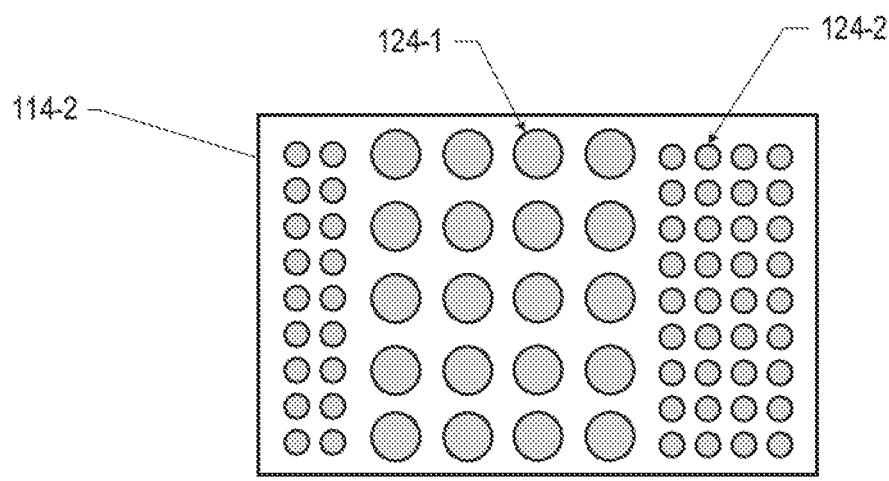
FIG. 1B is a top view of a die included in the microelectronic assembly of FIG. 1A, in accordance with various embodiments.

FIG. 1B is a top view of the die 114-2 of the microelectronic assembly 100 of FIG. 1A, showing the "coarser" conductive contacts 124-1 and the "finer" conductive contacts 124-2. The die 114-2 of the microelectronic assembly 100 may be a single-sided die (in the sense that the die 114-2 only has conductive contacts on a single surface), or, as shown, may be a double-sided die (in the sense that the die 114-2 has conductive contacts 122, 124 on two surfaces (e.g., a top surface and a bottom surface)), and may be a mixed-pitch die (in the sense that the die 114-2 has sets of conductive contacts 124-1, 124-2 with different pitches). Although FIG. 1B illustrates the conductive contacts 124-1, 124-2 as being arranged in a rectangular array, the conductive contacts 124-1, 124-2 may be arranged in any suitable pattern (e.g., triangular, hexagonal, rectangular, different arrangements between the conductive contacts 124-1, 124-2, etc.). Any of the conductive contacts disclosed herein (e.g., the conductive contacts 122, 124, and/or 146) may include bond pads, solder bumps, conductive posts, or any other suitable conductive contact, for example.

Figure 1C:
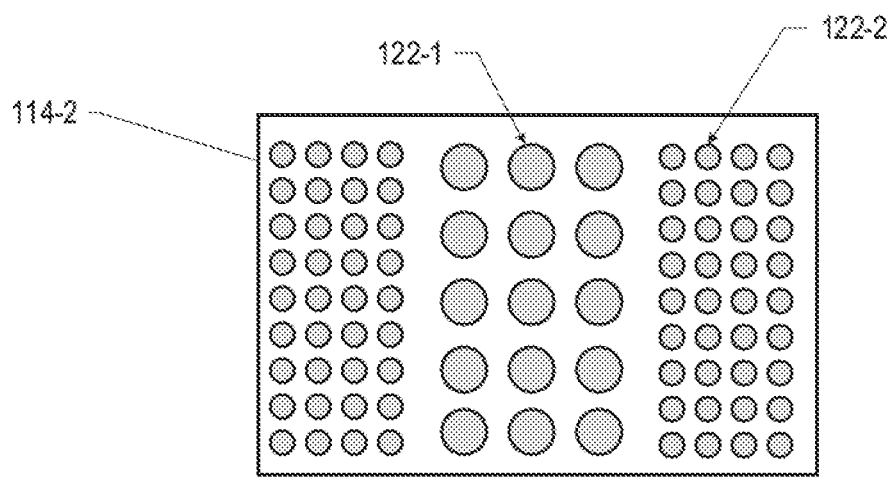
FIG. 1C is a bottom view of a die included in the microelectronic assembly of FIG. 1A, in accordance with various embodiments.

FIG. 1C is a bottom view of the die 114-2 of the microelectronic assembly 100 of FIG. 1A, showing the "coarser" conductive contacts 122-1 and the "finer" conductive contacts 122-2. The die 114-2 of the microelectronic assembly 100 may be a double-sided die, as shown, or may be a single-sided die, and may be a mixed-pitch die, as shown, or may be a single-pitch die. Although FIG. 1C illustrates the conductive contacts 122-1, 122-2 as being arranged in a rectangular array, the conductive contacts 122-1, 122-2 may be arranged in any suitable pattern (e.g., triangular, hexagonal, rectangular, different arrangements between the conductive contacts 122-1, 122-2, etc.).

As discussed above, in the embodiment of FIG. 1A, the die 114-1 may provide high density interconnect routing in a localized area of the microelectronic assembly 100. In some embodiments, the presence of the die 114-1 may support direct chip attach of fine-pitch semiconductor dies (e.g., the dies 114-2, 114-3, and 114-5) that cannot be attached entirely directly to the package substrate 102. In particular, as discussed above, the die 114-1 may support trace widths and spacings that are not achievable in the package substrate 102. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the microelectronic assemblies 100 disclosed herein may be capable of supporting chips with high density interconnects and chips with low-density interconnects without sacrificing performance or manufacturability.

The microelectronic assembly 100 of FIG. 1A may also include a circuit board (not shown). The package substrate 102 may be coupled to the circuit board by second-level interconnects at the bottom surface of the package substrate 102. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 102 to a circuit board, but may instead couple the package substrate 102 to another IC package, an interposer, or any other suitable component. In some embodiments, the multi-layer die subassembly may not be coupled to a package substrate 102, but may instead be coupled to a circuit board, such as a PCB.

The microelectronic assembly 100 of FIG. 1A may also include an underfill material 127. In some embodiments, the underfill material 127 may extend between one or more of the dies 114 and the package substrate 102 around the associated DTPS interconnects 150. In some embodiments, the underfill material 127 may extend between different ones of the dies 114 around the associated DTD interconnects 130. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering the dies 114-1, 114-4 to the package substrate 102 when forming the DTPS interconnects 150-1 and 150-2, and then polymerizes and encapsulates the DTPS interconnects 150-1 and 150-2. The underfill material 127 may be selected to have a coefficient of thermal expansion (CTE) that may mitigate or minimize the stress between the dies 114 and the package substrate 102 arising from uneven thermal expansion in the microelectronic assembly 100. In some embodiments, the CTE of the underfill material 127 may have a value that is intermediate to the CTE of the package substrate 102 (e.g., the CTE of the dielectric material of the package substrate 102) and a CTE of the dies 114.

The DTPS interconnects 150 disclosed herein may take any suitable form. In some embodiments, a set of DTPS interconnects 150 may include solder (e.g., solder bumps or balls that are subject to a thermal reflow to form the DTPS interconnects 150). DTPS interconnects 150 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects 150 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects 130 disclosed herein may take any suitable form. The DTD interconnects 130 may have a finer pitch than the DTPS interconnects 150 in a microelectronic assembly. In some embodiments, the dies 114 on either side of a set of DTD interconnects 130 may be unpackaged dies, and/or the DTD interconnects 130 may include small conductive bumps (e.g., copper bumps) attached to the conductive contacts 124 by solder. The DTD interconnects 130 may have too fine a pitch to couple to the package substrate 102 directly (e.g., to fine to serve as DTPS interconnects 150). In some embodiments, a set of DTD interconnects 130 may include solder. DTD interconnects 130 that include solder may include any appropriate solder material, such as any of the materials discussed above. In some embodiments, a set of DTD interconnects 130 may include an anisotropic conductive material, such as any of the materials discussed above. In some embodiments, the DTD interconnects 130 may be used as data transfer lanes, while the DTPS interconnects 150 may be used for power and ground lines, among others.

In some embodiments, some or all of the DTD interconnects 130 in a microelectronic assembly 100 may be metal-to-metal interconnects (e.g., copper-to-copper interconnects, or plated interconnects). In such embodiments, the conductive contacts 122, 124 on either side of the DTD interconnect 130 may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts 124). In some embodiments, one side of a DTD interconnect 130 may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 130 in a microelectronic assembly 100 may be solder interconnects that include a solder with a higher melting point than a solder included in some or all of the DTPS interconnects 150. For example, when the DTD interconnects 130 in a microelectronic assembly 100 are formed before the DTPS interconnects 150 are formed (e.g., as discussed below with reference to FIG. 4), solder-based DTD interconnects 130 may use a higher-temperature solder (e.g., with a melting point above 200 degrees Celsius), while the DTPS interconnects 150 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In the microelectronic assemblies 100 disclosed herein, some or all of the DTPS interconnects 150 may have a larger pitch than some or all of the DTD interconnects 130. DTD interconnects 130 may have a smaller pitch than DTPS interconnects 150 due to the greater similarity of materials in the different dies 114 on either side of a set of DTD interconnects 130 than between the die 114 and the package substrate 102 on either side of a set of DTPS interconnects 150. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the DTPS interconnects 150 may be formed larger and farther apart than DTD interconnects 130, which may experience less thermal stress due to the greater material similarity of the pair of dies 114 on either side of the DTD interconnects. In some embodiments, the DTPS interconnects 150 disclosed herein may have a pitch between 80 microns and 300 microns, while the DTD interconnects 130 disclosed herein may have a pitch between 7 microns and 100 microns.

Although FIG. 1A illustrates a specific number and arrangement of DTPS interconnects 150, DTD interconnects 130, and ML interconnects 152, these are simply illustrative, and any suitable number and arrangement may be used. The interconnects disclosed herein (e.g., DTPS, DTD, and ML interconnects) may be formed of any appropriate conductive material, such as copper, silver, nickel, gold, aluminum, or other metals or alloys, for example.

The multi-layer die subassembly 104 may include an insulating material (e.g., a dielectric material formed in multiple layers, as known in the art) to form the multiple layers and to embed one or more dies in a layer. In some embodiments, the insulating material of the multi-layer die subassembly may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The multi-layer die subassembly 104 may include one or more ML interconnects through the dielectric material (e.g., including conductive vias and/or conductive pillars, as shown). The multi-layer die subassembly 104 may have any suitable dimensions. For example, in some embodiments, a thickness of the multi-layer die subassembly 104 may be between 100 μm and 2000 μm. The multi-layer die subassembly 104 may have any suitable number of layers, any suitable number of dies, and any suitable die arrangement. For example, in some embodiments, the multi-layer die subassembly 104 may have between 3 and 20 layers of dies. In some embodiments, the multi-layer die subassembly 104 may include a layer having between 2 and 10 dies.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 9. The conductive pathways in the dies 114 may be bordered by liner materials, such as adhesion liners and/or barrier liners, as suitable.

In some embodiments, the die 114-1 and/or the die 114-4 may include conductive pathways to route power, ground, and/or signals to/from some of the other dies 114 included in the microelectronic assembly 100. For example, the die 114-1, 114-4 may include TSVs, including a conductive material via, such as a metal via, isolated from the surrounding silicon or other semiconductor material by a barrier oxide), or other conductive pathways through which power, ground, and/or signals may be transmitted between the package substrate 102 and one or more dies 114 "on top" (e.g., in one or more upper layers) of the die 114-1, 114-4 (e.g., in the embodiment of FIG. 1A, the die 114-2, the die 114-3, the die 114-5, and/or the die 114-6). In some embodiments, the die 114-1, 114-4 may include conductive pathways to route power, ground, and/or signals between different ones of the dies 114 "on top" of the die 114-1, 114-4 (e.g., in the embodiment of FIG. 1A, the die 114-2, the die 114-3, the die 114-5, and/or the die 114-6). In some embodiments, the die 114-1, 114-4 may be the source and/or destination of signals communicated between the die 114-1, 114-4 and other dies 114 included in the microelectronic assembly 100.

In some embodiments, the die 114-1 may not route power and/or ground to the die 114-2; instead, the die 114-2 may couple directly to power and/or ground lines in the package substrate 102 by ML interconnects 152. By allowing the die 114-2 to couple directly to power and/or ground lines in the package substrate 102 via ML interconnects 152, such power and/or ground lines need not be routed through the die 114-1, allowing the die 114-1 to be made smaller or to include more active circuitry or signal pathways.

In some embodiments, the die 114-1, 114-4 may only include conductive pathways, and may not contain active or passive circuitry. In other embodiments, the die 114-1, 114-4 may include active or passive circuitry (e.g., transistors, diodes, resistors, inductors, and capacitors, among others). In some embodiments, the die 114-1, 114-4 may include one or more device layers including transistors (e.g., as discussed below with reference to FIG. 9). When the die 114-1, 114-4 includes active circuitry, power and/or ground signals may be routed through the package substrate 102 and to the die 114-1, 114-4 through the conductive contacts 122 on the bottom surface of the die 114-1, 114-4.

The elements of the microelectronic assembly 100 may have any suitable dimensions. Only a subset of the accompanying figures are labeled with reference numerals representing dimensions, but this is simply for clarity of illustration, and any of the microelectronic assemblies 100 disclosed herein may have components having the dimensions discussed herein. In some embodiments, the thickness 164 of the package substrate 102 may be between 0.1 millimeters and 3 millimeters (e.g., between 0.3 millimeters and 2 millimeters, between 0.25 millimeters and 0.8 millimeters, or approximately 1 millimeter).

Many of the elements of the microelectronic assembly 100 of FIG. 1A are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

Figure 2B:
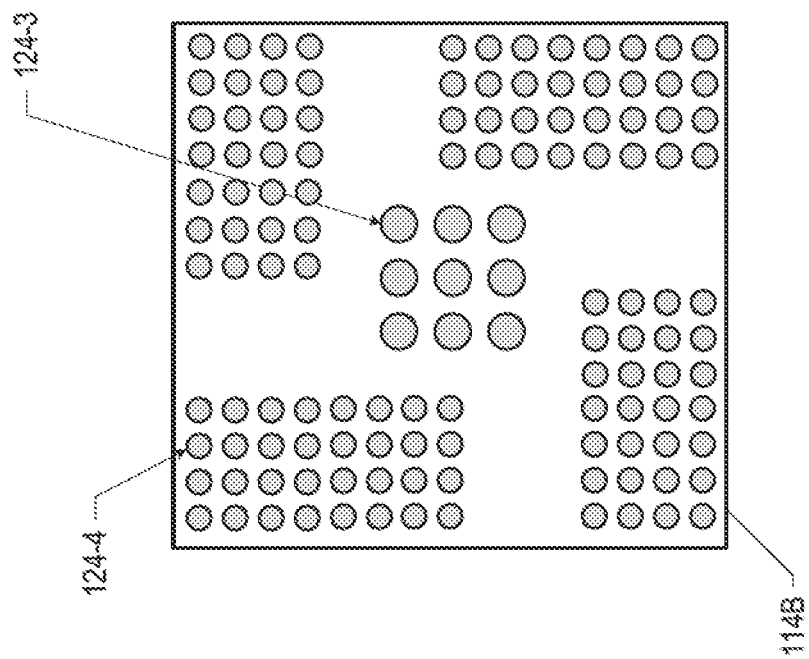
FIG. 2B is a top view of a die included in the example arrangement of FIG. 2A, in accordance with various embodiments.
Figure 2A:
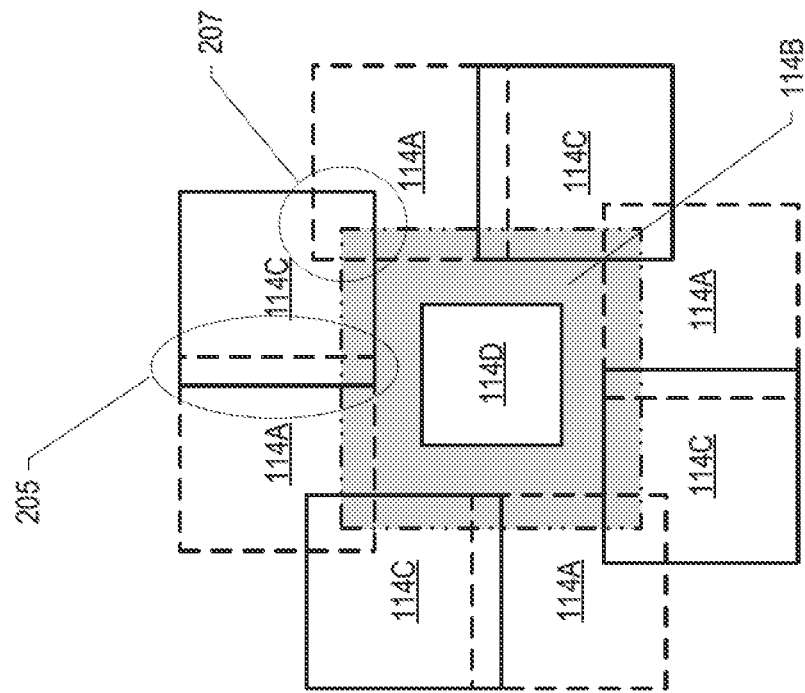
FIG. 2A is a top view of an example arrangements of multiple dies in a microelectronic assembly, in accordance with various embodiments.

FIG. 2A illustrates an arrangement in which multiple dies 114A are disposed below a middle die 114B, multiple dies 114C are disposed above the middle die 114B, and a die 114D is disposed wholly above the middle die 114B (e.g., in the manner disclosed herein with reference to the die 114-6). The dies 114 may be the same die or may be different dies, and may include any suitable circuitry. For example, in some embodiments, the die 114A, 114C, 114D may be an active or passive die, and the die 114B may include input/output circuitry, high bandwidth memory, and/or enhanced dynamic random access memory (EDRAM). The dies 114A may be connected to a package substrate 102 (not shown) in any of the manners disclosed herein with reference to the die 114-1, and connected to the middle die 114B by any of the DTD interconnects disclosed herein. The dies 114C and 114D may be connected to the middle die 114B by any of the DTD interconnects disclosed herein. In FIG. 2A, the dies 114A "overlap" the edges 205 and/or the corners 207 of the adjacent dies 114C. Placing dies 114A at least partially over dies 114C may reduce routing congestion and may improve utilization of the dies by enabling the die 114A to be connected to the die 114C by any of the ML interconnects disclosed herein. The dies 114A, 114C, and 114D may be singled-sided dies or double-sided dies and may be a single-pitch die or a mixed-pitch die.

FIG. 2B is a top view of the die 114B, showing a mixed-pitch die with the "coarser" conductive contacts 124-3 and the "finer" conductive contacts 124-4 arranged with the finer conductive contacts 124-4 framing the coarser conductive contacts 124-3. FIG. 2A illustrates an arrangement of multi-layer dies and an arrangement of conductive contacts on a surface of a die, however, these arrangements are simply exemplary, and any suitable arrangements may be used.

Figure 3:
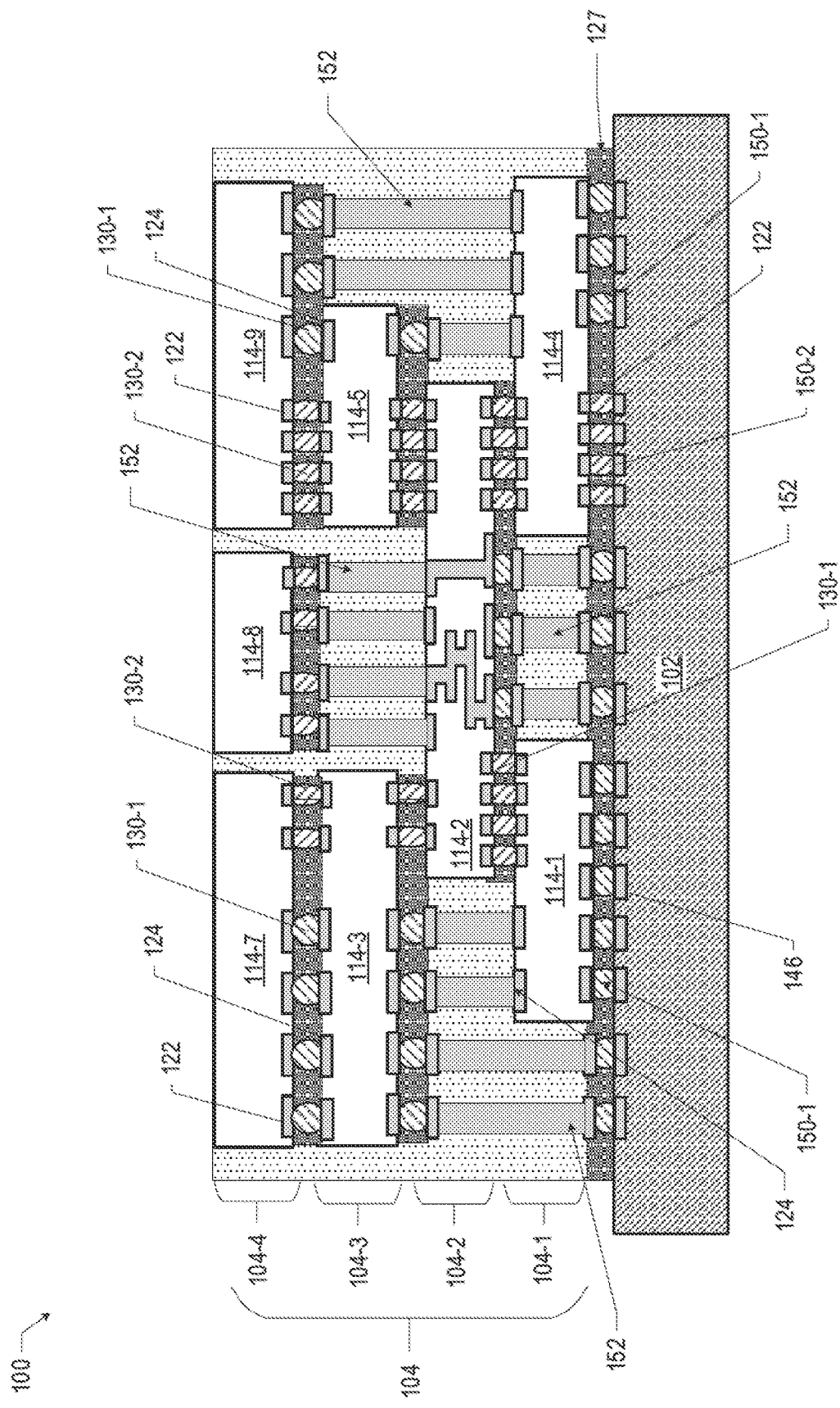
FIG. 3 is a side, cross-sectional view of an example microelectronic assembly, in accordance with various embodiments.

In the embodiment of FIG. 1A, a multi-layer die subassembly 104 is illustrated as having three layers. In some embodiments of the microelectronic assemblies 100 disclosed herein, the multi-layer die subassembly 104 may have more than three layers. For example, FIG. 3 illustrates an embodiment of a microelectronic assembly 100 in which a multi-layer die subassembly 104 has four layers 104-1, 104-2, 104-3, 104-4. The first layer 104-1 may include the dies 114-1 and 114-4, and the second layer 104-2 may include the die 114-2, as discussed above with reference to FIG. 1A. The third layer 104-3 may include the dies 114-3 and 114-5, as discussed above with reference to FIG. 1A, which may further include conductive contacts 124 on the top surface of the dies 114-3, 114-5, and may have the die 114-6 omitted. The fourth layer 104-4 may include a die 114-7, a die 114-8 and a die 114-9, and the dies 114-7, 114-8, 114-9 may include conductive contacts 122 on a bottom surface of the dies 114-7, 114-8, 114-9. As shown for the die 114-7, the conductive contacts 122 on the bottom surface of the die 114-7 may be electrically and mechanically coupled to the conductive contacts 124 on the top surface of the die 114-3 by DTD interconnects 130-1 and 130-2. As shown for die 114-8, the conductive contacts 122 on the bottom surface of the die 114-8 may be electrically and mechanically coupled to the conductive contacts 124 on the top surface of the die 114-2 by ML interconnects 152. As shown for the die 114-9, the conductive contacts 122 on the bottom surface of the die 114-9 may be electrically and mechanically coupled to the conductive contacts 124 on the top surface of the die 114-5 by DTD interconnects 130-1 and 130-2, and may be electrically and mechanically coupled to the conductive contacts 124 on the top surface of the die 114-4 by ML interconnects 152.

Any suitable techniques may be used to manufacture the microelectronic assemblies disclosed herein. For example, FIGS. 4A-4I are side, cross-sectional views of various stages in an example process for manufacturing the microelectronic assembly 100 of FIG. 3, in accordance with various embodiments. Although the operations discussed below with reference to FIGS. 4A-4I (and others of the accompanying drawings representing manufacturing processes) are illustrated in a particular order, these operations may be performed in any suitable order. Additionally, although particular assemblies are illustrated in FIGS. 4A-4I (and others of the accompanying drawings representing manufacturing processes), the operations discussed below with reference to FIGS. 4A-4I may be used to form any suitable assemblies. In some embodiments, microelectronic assemblies 100 manufactured in accordance with the process of FIGS. 4A-4I (e.g., any of the microelectronic assemblies 100 disclosed herein) may have DTPS interconnects 150 that are solder interconnects, and DTD interconnects 130 that are non-solder interconnects (e.g., metal-to-metal interconnects or anisotropic conductive material interconnects). In the embodiment of FIGS. 4A-4I, the dies 114 may first be assembled into a composite die, and then the composite die may be coupled to the package substrate 102. This approach may allow for tighter tolerances in the formation of the DTD interconnects 130, and may be particularly desirable for relatively small dies 114 and for a composite die having three or more layers.

FIG. 4A illustrates an assembly 400A including a carrier 402 subsequent to forming conductive pillars 434 on the top surface of the carrier 402. The carrier 402 may include any suitable material for providing mechanical stability during manufacturing operations. The conductive pillars 434 may be disposed to form one or more de-population regions 455 in which no conductive pillars 434 are present. The conductive pillars 434 may take the form of any of the embodiments disclosed herein, and may be formed using any suitable technique, for example, a lithographic process or an additive process, such as cold spray or 3-dimensional printing). For example, the conductive pillars 434 may be formed by depositing, exposing, and developing a photoresist layer on the top surface of the carrier 402. The photoresist layer may be patterned to form cavities in the shape of the conductive pillars. Conductive material, such as copper, may be deposited in the openings in the patterned photoresist layer to form the conductive pillars 434. The conductive material may be depositing using any suitable process, such as electroplating, sputtering, or electroless plating. The photoresist may be removed to expose the conductive pillars 434. The conductive pillars 434 may include any suitable conductive material, for example, a metal, such as, copper. The conductive pillars 434 may be formed to have a thickness that is approximately equal to a thickness of the thickest die in the layer. In some embodiments, the dies 114-1 and 114-4 may have a same thickness. In some embodiments, the dies 114-1 and 114-4 may have a different thickness, and the conductive pillars may have a thickness equal to the greater thickness (e.g., as shown in FIG. 5). In some embodiments, a seed layer 483 may be formed on the top surface of the carrier prior to depositing the photoresist material and the conductive material. The seed layer 483 may be any suitable conductive material, including copper. The seed layer 483 may be removed, after removing the photoresist layer, using any suitable process, including chemical etching, among others. In some embodiments, the seed layer may be omitted.

The conductive pillars 434 may be formed of any suitable conductive material, such as a metal. In some embodiments, the conductive pillars 434 may include copper. The conductive pillars 434 may have any suitable dimensions and may span one or more layers to form ML interconnects. For example, in some embodiments, an individual conductive pillar 434 may have an aspect ratio (height:diameter) between 1:1 and 4:1 (e.g., between 1:1 and 3:1). In some embodiments, an individual conductive pillar 434 may have a diameter between 10 microns and 300 microns. In some embodiments, an individual conductive pillar 434 may have a diameter between 50 microns and 400 microns. In some embodiments, the copper pillars may have a height between 10 and 300 microns. The conductive pillars may have any suitable cross-sectional shape, for example, square, triangular, and oval, among others. In some embodiments, the conductive pillars may be coupled to a top surface of a die 114 for thermal conduction purposes.

FIG. 4B illustrates an assembly 400B subsequent to placing the dies 114-1, 114-4 in the de-population regions 455 of the assembly 400A (FIG. 4A). The die 114 may be placed on the carrier 402 using any suitable technique, such as die attach film (DAF). The die 114 may include a non-electrical material layer (not shown) or a carrier (not shown) on top of the die 114 that provides improved mechanical stability. The non-electrical material layer, which is an inactive portion of the die 114, may include silicon, ceramic, or quartz, among other materials. The non-electrical material layer may be attached to the die 114 using any suitable technique, including, for example, a release layer. The release layer (also referred to herein as a debonding layer) may include a temporary adhesive, or other material that releases when exposed to heat or light, for example. The non-electrical material layer may be removed using any suitable technique, including, for example, grinding, etching, such as reactive ion etching (RIE) or chemical etching, or, if the debonding layer includes a photo-reactive or thermally-reactive material, applying light or heat. The carrier may include any suitable material to provide mechanical stability. The carrier may be attached to the die 114 using any suitable technique, including, for example, a removable adhesive.

FIG. 4C illustrates an assembly 400C subsequent to providing an insulating material 430 around the dies 114-1, 114-4 and the conductive pillars 434 of the assembly 400B (FIG. 4B). In some embodiments, the insulating material 430 may be initially deposited on and over the tops of the conductive pillars 434 and the dies 114-1, 114-4 then polished back to expose the conductive contacts 124 at the top surface of the dies 114-1, 114-4 and the top surfaces of the conductive pillars 434. In some embodiments, the insulating material 430 is a mold material, such as an organic polymer with inorganic silica particles. In some embodiments, the insulating material 430 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The dielectric material may be formed using any suitable process, including lamination, or slit coating and curing. If the dielectric layer is formed to completely cover the conductive pillars 434 and the dies 114-1, 114-4, the dielectric layer may be removed to expose the conductive contacts 124 at the top surface of the dies 114-1, 114-4 and the top surfaces of the conductive pillars 434 using any suitable technique, including grinding, or etching, such as a wet etch, a dry etch (e.g., a plasma etch), a wet blast, or a laser ablation (e.g., using excimer laser). In some embodiments, the thickness of the insulating layer 430 may be minimized to reduce the etching time required.

Figure 4D:
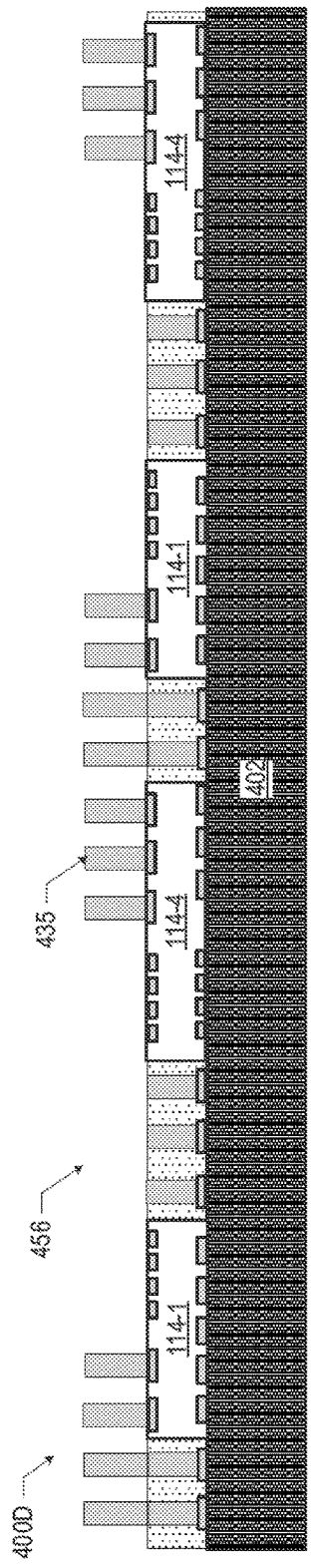

FIG. 4D illustrates an assembly 400D subsequent to forming conductive pillars 435 on the conductive contacts 124 at the top surface of the dies 114-1, 114-4 and on the top surface of one or more conductive pillars 434. The conductive pillars 435 may take the form of any of the embodiments disclosed herein, and may be formed using any suitable technique (e.g., as describe above with reference to FIG. 4A). The conductive pillars 435 may be disposed to form one or more de-population regions 456 in which no conductive pillars 435 are present.

Figure 4E:
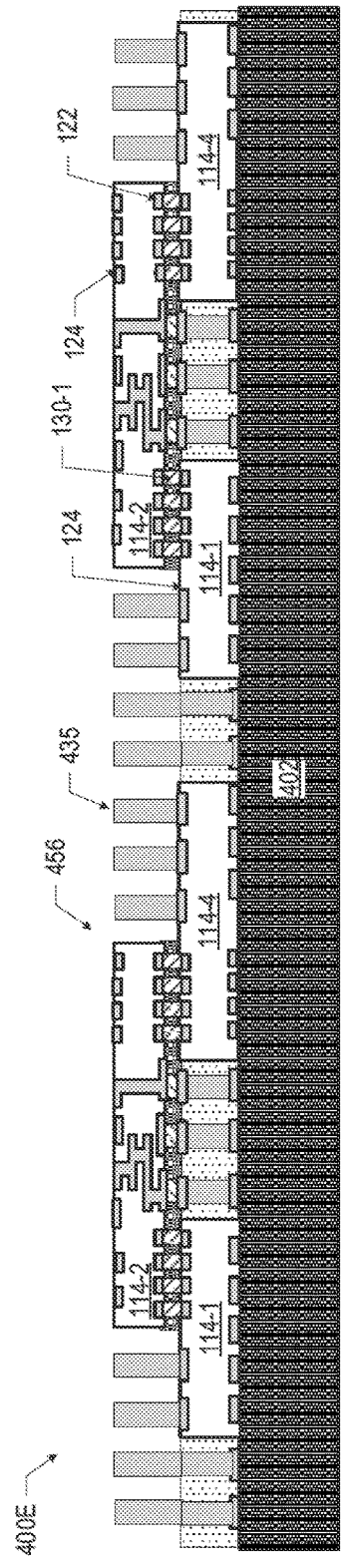

FIG. 4E illustrates an assembly 400E subsequent to placing the dies 114-2 in the de-population regions 456 of the assembly 400D (FIG. 4D) and coupling the die 114-2 to the dies 114-1 and 114-4, such that the conductive contacts 122 on the bottom surface of the die 114-2 may be coupled to the conductive contacts 124 on the top surface of the dies 114-1 and 114-4 (via DTD interconnects 130-1). Any suitable technique may be used to form the DTD interconnects 130 of the assembly 400E, such as metal-to-metal attachment techniques, solder techniques, or anisotropic conductive material techniques, disclosed herein. The die 114-2 may be placed on the carrier 402 using any suitable technique, such as described above with reference to FIG. 4B. In some embodiments, underfill material may be applied between the die 114-2 and the dies 114-1, 114-4, and/or may be applied to the DTD interconnects 130. In some embodiments, a die may include a pre-attached NCF.

Figure 4F:
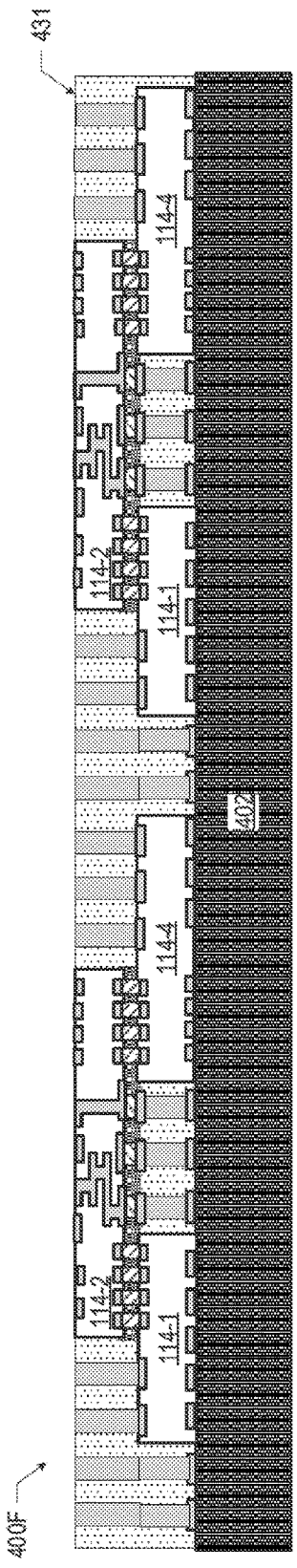

FIG. 4F illustrates an assembly 400F subsequent to providing an insulating material 431 around the dies 114-2 and the conductive pillars 435 of the assembly 400E (FIG. 4E). The insulating material 431 may be formed as described above with reference to FIG. 4C.

Figure 4G:
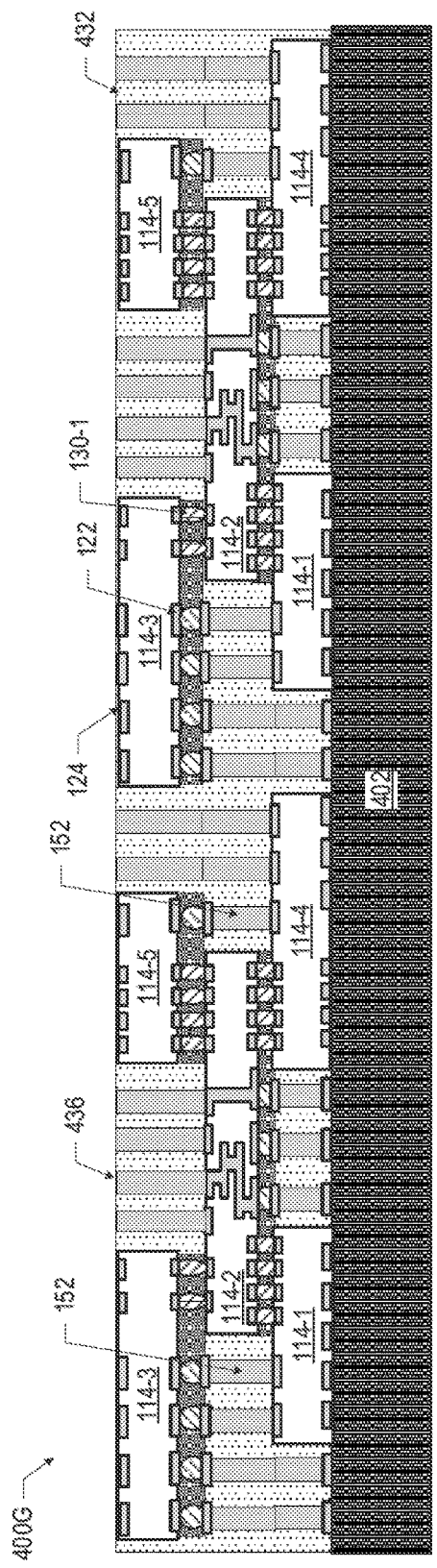

FIG. 4G illustrates an assembly 400G subsequent to forming another layer on assembly 400F by repeating the process described in FIGS. 4D-4F. As shown in FIG. 4G, assembly 400G may be formed by forming conductive pillars 436 on the conductive contacts 124 at the top surface of the die 114-2 and on the top surface of one or more conductive pillars 435, placing and coupling the dies 114-3, 114-5 to the die 114-2 via DTD interconnects, and providing an insulating material 432 around the dies 114-3, 114-5 and the conductive pillars 436. The die 114-3 may be coupled to the die 114-1 by ML interconnects 152, and the die 114-5 may be coupled to the die 114-4 by ML interconnect 152.

Figure 4H:
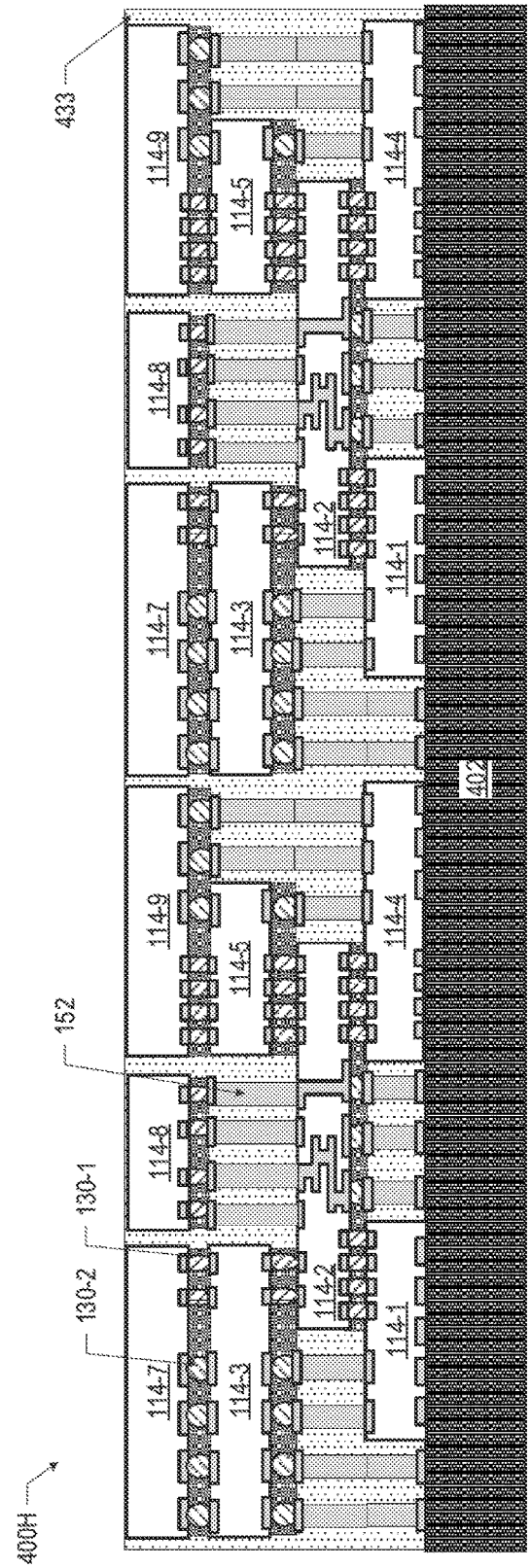

FIG. 4H illustrates an assembly 400H subsequent to forming another layer on assembly 400G by repeating the process described in FIGS. 4E-4F. As shown in FIG. 4H, assembly 400H may be formed by placing the dies 114-7, 114-8, 114-9, and providing an insulating material 433 around the dies. The die 114-7 may be coupled to the die 114-3 by DTD interconnects 130-1, 130-2. The die 114-8 may be coupled to the die 114-2 by ML interconnects 152. The die 114-9 may be coupled to the die 114-5 by DTD interconnects 130-1, 130-2, and may be coupled to the die 114-4 by ML interconnects 152. Additional layers of the composite die may be built up by repeating the process as described with respect to FIGS. 4D-4F.

Figure 4I:
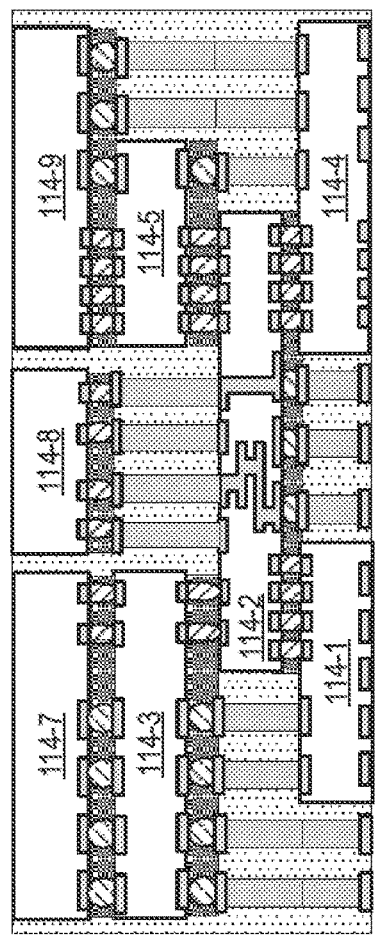
Figure 4I:
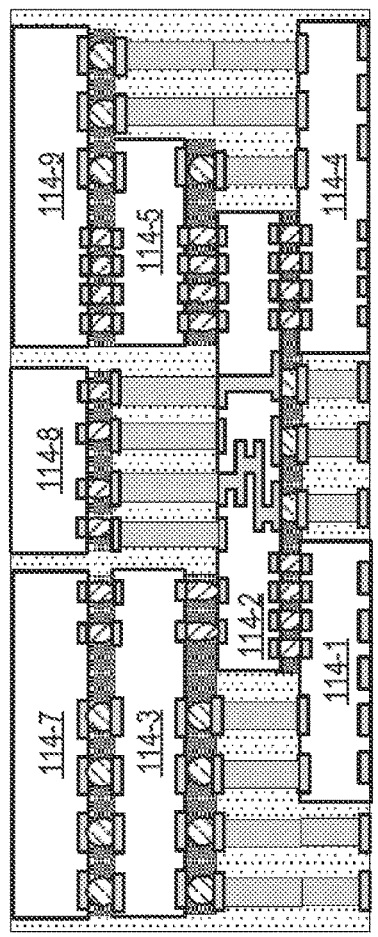

FIG. 4I illustrates an assembly 400I subsequent to removing the carrier 402 and singulating the composite dies. Further operations may be performed as suitable either before or after singulating (e.g., depositing a mold material, attaching a heat spreader, depositing a solder resist layer, attaching solder balls for coupling to a package substrate or to a circuit board, etc.). Although assembly 400I has conductive contacts 122 on the bottom surface of the dies 114-1 and 114-4 for electrically coupling to a package substrate or a circuit board, in some embodiments, the dies 114-7, 114-8, and/or 114-9 may include conductive contacts on a top surface such that the assembly may be inverted or "flipped" and coupled to a package substrate or circuit board via interconnects on the top surface of the dies 114-7, 114-8, and/or 144-9.

In some embodiments of the microelectronic assemblies 100 disclosed herein, the multi-layer die subassembly 104 may include a redistribution layer (RDL) 148, also referred to herein as a package substrate portion. For example, FIG. 5 illustrates an embodiment of a microelectronic assembly 100 in which a multi-layer die subassembly 104 has four layers 104-1, 104-2, 104-3, 104-4, and an RDL between the second layer 104-2 and the third layer 104-3. The first layer 104-1 may include the dies 114-1 and 114-4, and the second layer 104-2 may include the die 114-2, as discussed above with reference to FIG. 3. The third layer 104-3 may include the dies 114-3 and 114-10, which may include conductive contacts 122 on the bottom surface of the dies 114-3, 114-10 and conductive contacts 124 on the top surface of the dies 114-3, 114-10. As shown for the die 114-3, the conductive contacts 122 on the bottom surface of the die 114-3 may be electrically and mechanically coupled to the conductive contacts 174 on the top surface of the RDL 148 by die-to-RDL (DTRDL) interconnects 155-1, 155-2. As shown for the die 114-10, the conductive contacts 122 on the bottom surface of the die 114-10 may be electrically and mechanically coupled to the conductive contacts 174 on the top surface of the RDL 148 by DTRDL interconnects 155-2, 155-3. Any suitable technique may be used to form the DTRDL interconnects 155 disclosed herein, such as plating techniques, solder techniques, or anisotropic conductive material techniques. The fourth layer 104-4 may include a die 114-11, a die 114-12 and a die 114-13, and the dies 114-11, 114-12, 114-13 may include conductive contacts 122 on a bottom surface of the dies 114-11, 114-12, 114-13. As shown for the die 114-11, the conductive contacts 122 on the bottom surface of the die 114-11 may be electrically and mechanically coupled to the conductive contacts 124 on the top surface of the die 114-3 by DTD interconnects 130-1 and 130-2. As shown for the die 114-12, the conductive contacts 122 on the bottom surface of the die 114-12 may be electrically and mechanically coupled to the conductive contacts 174 on the top surface of the RDL 148 by ML interconnects 152. As shown for the die 114-13, the conductive contacts 122 on the bottom surface of the die 114-13 may be electrically and mechanically coupled to the conductive contacts 124 on the top surface of the die 114-10 by DTD interconnects 130-1 and 130-2, and may be electrically and mechanically coupled to the conductive contacts 174 on the top surface of the RDL 148 by ML interconnects 152.

Although FIG. 5 shows a multi-layer die subassembly 104 having a single RDL, any number of RDLs may be included in a composite die and may be positioned between any die layers. In some embodiments, a microelectronic assembly may include an RDL above a layer having a conductive pillar to provide additional routing capability. The RDL 148 may be formed using any suitable technique, such as any of the techniques discussed above with reference to the formation of the package substrate 102 of FIG. 1A. In some embodiments, forming the RDL 148 may include plating the conductive contacts 122 of the die 114-1 with a metal or other conductive material as part of forming the proximate conductive contacts 174 of the RDL 148; consequently, the DTRDL interconnects 155 between the die 114-3, 114-10 and the RDL 148 may be plated interconnects. The dies 114-3 and 114-10 may then be attached to the top surface of the RDL 148 in accordance with any of the techniques disclosed herein, including the DTRDL interconnects 155 that are solder interconnects, and DTRDL interconnects 155 that are non-solder interconnects (e.g., plated interconnects).

In some embodiments of the microelectronic assemblies 100 disclosed herein, the dies 114 included in the multi-layer die subassembly 104 may have different thicknesses. For example, as shown in FIG. 5, the die 114-10 may have a thickness 165 that is smaller than a thickness 167 of the die 114-3, and the dies 114-11, 114-12, 114-13 may have a thickness 169 that is greater than a thickness 167 of the die 114-3. Although FIG. 5 illustrates the dies 114-11, 114-12, 114-13 as having the same thickness, the dies 114 may have any suitable thickness and may have varying thicknesses. In some embodiments, a thickness of a die in the top layer maybe greater than a thickness of a die in a layer other than the top layer to prevent breakage during singulation as the greater die thickness may provide increased mechanical strength and support. In some embodiments, the dies 114 may be made thicker or thinner for thermal and/or electrical purposes.

Figure 6F:
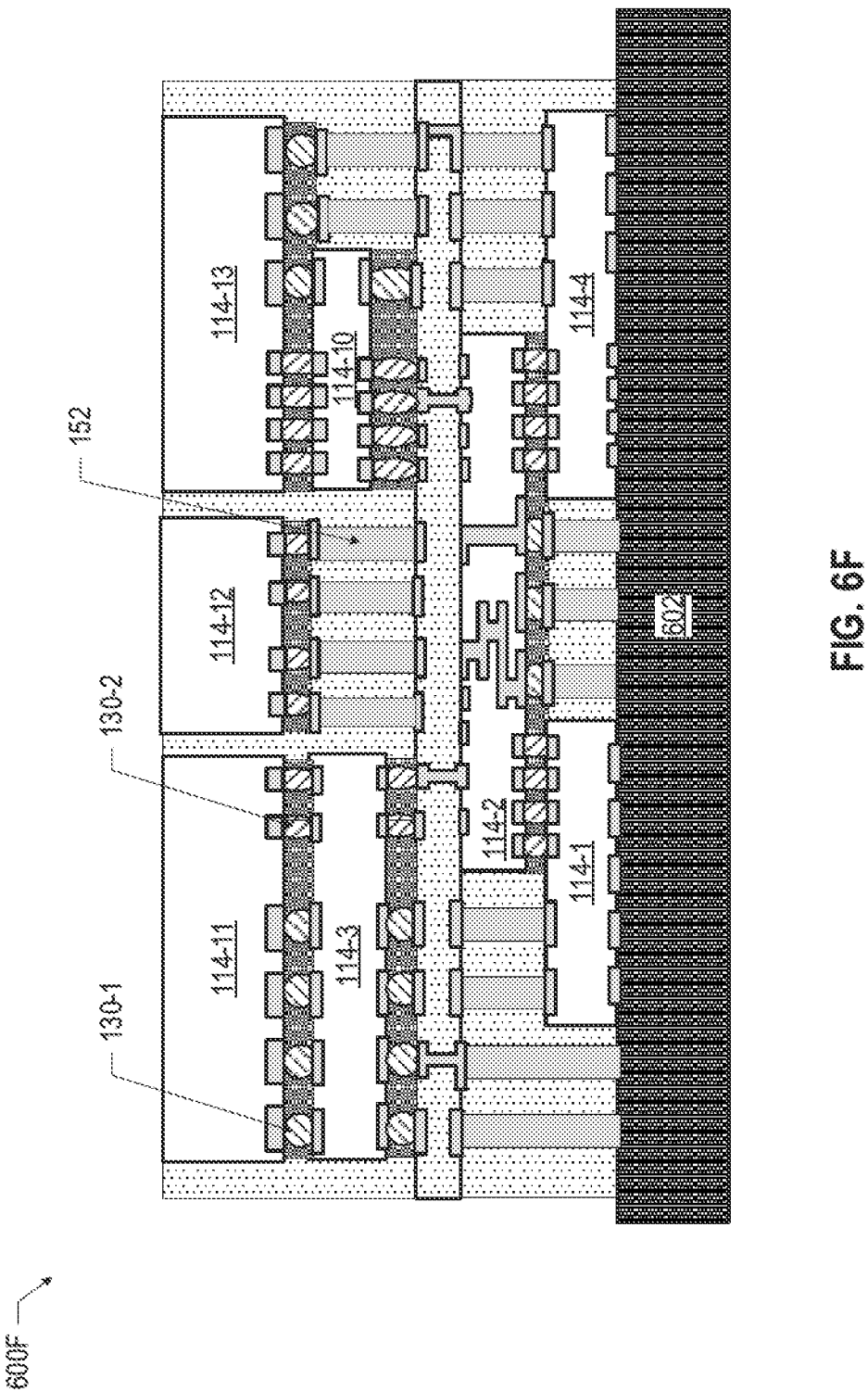

FIGS. 6A-6F are side, cross-sectional views of various stages in an example process for manufacturing the microelectronic assembly 100 of FIG. 5, in accordance with various embodiments. FIG. 6A illustrates an assembly 600A including a carrier 602 subsequent to forming conductive pillars 634 on the top surface of the carrier 602. The carrier 402 may include any suitable material for providing mechanical stability during manufacturing operations, as described above with reference to FIG. 4. The conductive pillars 634 may be disposed to form one or more de-population regions 655 in which no conductive pillars 634 are present. The conductive pillars 634 may take the form of any of the embodiments disclosed herein, and may be formed using any suitable technique, for example, as described above with reference to FIG. 4.

FIG. 6B illustrates an assembly 600B subsequent to placing the dies 114-1, 114-4 in the de-population regions 655 of the assembly 600A (FIG. 6A), and providing an insulating material 630 around the dies 114-1, 114-4 and the conductive pillars 634 of the assembly 600A (FIG. 6A). The dies 114 may be placed on the carrier 602 using any suitable technique, and the insulating material may be provided using any suitable technique, such as described above with reference to FIG. 4.

FIG. 6C illustrates an assembly 600C subsequent to forming a second die layer on the assembly 600B. The second die layer may be formed by forming conductive pillars 635 on the conductive contacts 124 at the top surface of the dies 114-1, 114-4 and on the top surface of one or more conductive pillars 634, placing the die 114-2, and providing an insulating material 631 around the die 114-2 and the conductive pillars 635. The conductive pillars 635 may take the form of any of the embodiments disclosed herein, and may be formed using any suitable technique (e.g., as describe above with reference to FIG. 4). The die 114-2 may be coupled to the dies 114-1, 114-4 by DTD interconnects 130-2 and to the conductive pillars 634, as described above with reference to FIG. 4.

FIG. 6D illustrates an assembly 600D subsequent to forming a RDL 648 on the assembly 600C. The RDL 148 may be manufactured using any suitable technique, such as a PCB technique or a redistribution layer technique. The RDL 648 may include conductive contacts 672 on a bottom surface and conductive contacts 674 on a top surface of the RDL 648.

FIG. 6E illustrates an assembly 600E subsequent to forming a third die layer on the assembly 600D. The third die layer may be formed by forming conductive pillars 636 on the conductive contacts 674 on the top surface of the RDL 648, placing and coupling the dies 114-3 and 114-10, and providing an insulating material 632 around the dies 114-3, 114-10 and the conductive pillars 636. The conductive pillars 635 may take the form of any of the embodiments disclosed herein, and may be formed using any suitable technique (e.g., as describe above with reference to FIG. 4). The dies 114-3 and 114-10 may be coupled to the conductive contacts 174 on the top surface of the RDL 648 by DTRDL interconnects 155-1, 155-2, and 155-3, as described above with reference to FIG. 5.

FIG. 6F illustrates an assembly 600F subsequent to forming a fourth die layer on assembly 600E by repeating the process described in FIG. 6C and/or FIGS. 4D-4F. As shown in FIG. 6F, assembly 600F may be formed by placing and coupling the dies 114-11, 114-12, and 114-13, and providing an insulating material around the dies 114-11, 114-12, 114-13. The die 114-11 may be coupled to the die 114-3 by DTD interconnects 130-1, 130-2, the die 114-12 may be coupled to the RDL 648 by ML interconnects 152, and the die 114-13 may be coupled to the die 114-10 by DTD interconnects 130-1, 130-2 and coupled to the RDL 648 by ML interconnects 152. Additional die layer and/or RDL may be built up by repeating the process as described with respect to FIGS. 6A-6F. Although FIG. 6 shows assembly 600 as a single multi-layer die assembly, multiple assemblies may be formed on the carrier 602, removed from the carrier 602, and then singulated. Assembly 600F may be removed from carrier 602 and further operations may be performed as suitable (e.g., attaching to a package substrate 102, etc.).

Figure 7:
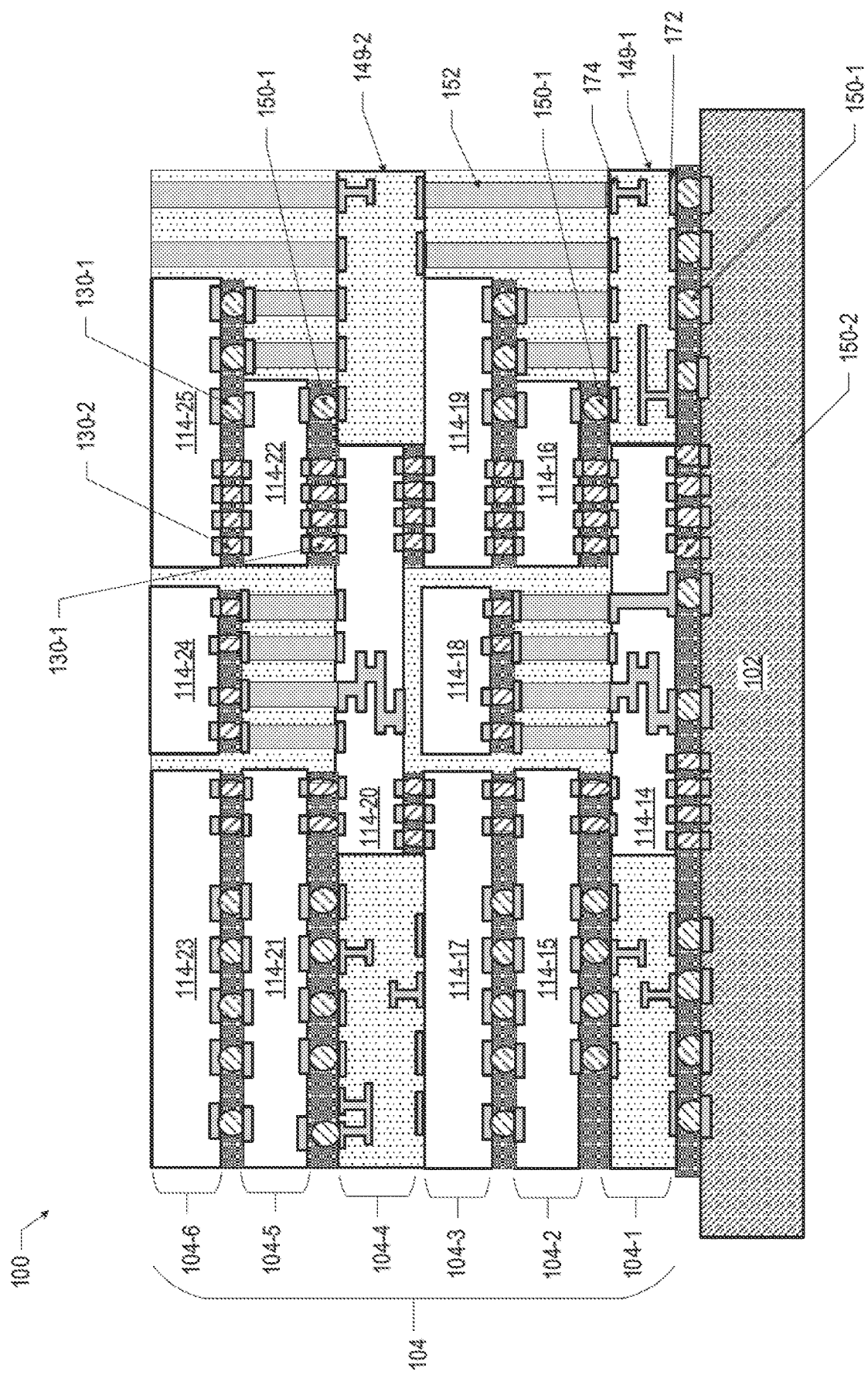
FIG. 7 is a side, cross-sectional view of an example microelectronic assemblies, in accordance with various embodiments.

In some embodiments of the microelectronic assemblies 100 disclosed herein, the multi-layer die subassembly 104 may include a die 114 embedded in package substrate portion 149. For example, FIG. 7 illustrates an embodiment of a microelectronic assembly 100 in which a multi-layer die subassembly 104 has six die layers 104-1, 104-2, 104-3, 104-4, 104-5, 104-6, and two layers (e.g., the first layer 104-1 and the fourth layer 104-4) may include package substrate portion 149. The package substrate portion 149 may include conductive contacts 172 on a bottom surface and conductive contacts 174 on a top surface of the package substrate portion 149. Any suitable technique may be used to form the package substrate portion 149, including, for example, a bumpless build-up layer technique, a carrier-based panel-level coreless package substrate manufacturing technique, or an embedded panel-level bonding technique. In some embodiments, forming the package substrate portion 149 may include plating the conductive contacts 124 on the top surface of the die 114 with a metal or other conductive material as part of forming the proximate conductive contacts 174 on the top surface of the package substrate portion 149; consequently, the DTPS interconnects 150 between the die 114 and the package substrate portion 149 may be plated interconnects.

As shown in FIG. 7, the first layer 104-1 may include the die 114-14 embedded in package substrate portion 149-1. The die 114-14 may be coupled to the package substrate 102 by DTPS interconnects 150-1, 150-2. The second layer 104-2 may include the dies 114-15 and 114-16. The die 114-15 may be coupled to the package substrate portion 149-1 by DTPS interconnects 150-1 and coupled to the die 114-14 by DTD interconnects 130-2. The die 114-16 may be coupled to the package substrate portion 149-1 by DTPS interconnects 150-1 and may be coupled to the die 114-14 by DTD interconnects 130-2. The third layer 104-3 may include the dies 114-17, 114-18, and 114-19. The die 114-17 may be coupled to the die 114-15 by DTD interconnects 130-1, 130-2. The die 114-18 may be coupled to the die 114-14 by ML interconnects 152. The die 114-19 may be coupled to the die 114-16 by DTD interconnects 130-1, 130-2 and to the package substrate portion 149-1 by ML interconnects 152. The fourth layer 104-4 may include die 114-20 embedded in a package substrate portion 149-2. The die 114-20 may be coupled to the dies 114-17 and 114-19 by DTD interconnects 130-2. The fifth layer 104-5 may include dies 114-21 and 114-22. The die 114-21 may be coupled to the package substrate portion 149-2 by DTPS interconnects 150-1 and may be coupled to the die 114-20 by DTD interconnects 130-2. The die 114-22 may be coupled to the die 114-20 by DTD interconnects 130-2 and may be coupled to the package substrate portion 149-2 by DTPS interconnects 150-1. The sixth layer 104-6 may include dies 114-23, 114-24, and 114-25. The die 114-23 may be couple to the die 114-21 by DTD interconnects 130-1, 130-2. The die 114-24 may be coupled to the die 114-20 by ML interconnects 152. The die 114-25 may be coupled to the die 114-22 by DTD interconnects 130-1, 130-2 and may be coupled to the package substrate portion 149-2 by ML interconnects 152. The DTPS interconnects 150, the DTD interconnects 130, and the ML interconnects 152 may be any of the respective interconnects disclosed herein.

Although FIG. 7 shows a particular number and arrangement of dies, interconnects, and package substrate portions, any number and arrangement of dies, interconnects, and package substrate portions may be used, and may further include one or more RDLs.

The microelectronic assemblies 100 disclosed herein may be used for any suitable application. For example, in some embodiments, a microelectronic assembly 100 may be used to provide an ultra-high density and high bandwidth interconnect for field programmable gate array (FPGA) transceivers and III-V amplifiers.

More generally, the microelectronic assemblies 100 disclosed herein may allow "blocks" of different kinds of functional circuits to be distributed into different ones of the dies 114, instead of having all of the circuits included in a single large die, per some conventional approaches. In some such conventional approaches, a single large die would include all of these different circuits to achieve high bandwidth, low loss communication between the circuits, and some or all of these circuits may be selectively disabled to adjust the capabilities of the large die. However, because the ML interconnects 152, and/or the DTD interconnects 130 of the microelectronic assemblies 100 may allow high bandwidth, low loss communication between different ones of the dies 114 and different ones of the dies 114 and the package substrate 102, different circuits may be distributed into different dies 114, reducing the total cost of manufacture, improving yield, and increasing design flexibility by allowing different dies 114 (e.g., dies 114 formed using different fabrication technologies) to be readily swapped to achieve different functionality.

In another example, a die 114-2 that includes active circuitry in a microelectronic assembly 100 may be used to provide an "active" bridge between other dies 114 (e.g., between the dies 114-1 and 114-4, or between the dies 114-1 and 114-3, in various embodiments). In another example, the die 114-1 in a microelectronic assembly 100 may be a processing device (e.g., a central processing unit, a graphics processing unit, a FPGA, a modem, an applications processor, etc.), and the die 114-2 may include high bandwidth memory, transceiver circuitry, and/or input/output circuitry (e.g., Double Data Rate transfer circuitry, Peripheral Component Interconnect Express circuitry, etc.). In some embodiments, the die 114-1 may include a set of conductive contacts 124 to interface with a high bandwidth memory die 114-2, a different set of conductive contacts 124 to interface with an input/output circuitry die 114-2, etc. The particular high bandwidth memory die 114-2, input/output circuitry die 114-2, etc. may be selected for the application at hand.

In another example, the die 114-2 in a microelectronic assembly 100 may be a cache memory (e.g., a third level cache memory), and one or more dies 114-1, 114-4, 114-3, and/or 114-5 may be processing devices (e.g., a central processing unit, a graphics processing unit, a FPGA, a modem, an applications processor, etc.) that share the cache memory of the die 114-2.

In another example, a die 114 may be a single silicon substrate or may be a composite die, such as a memory stack.

The microelectronic assemblies 100 disclosed herein may be included in any suitable electronic component. FIGS. 8-11 illustrate various examples of apparatuses that may include, or be included in, any of the microelectronic assemblies 100 disclosed herein.

Figure 8:
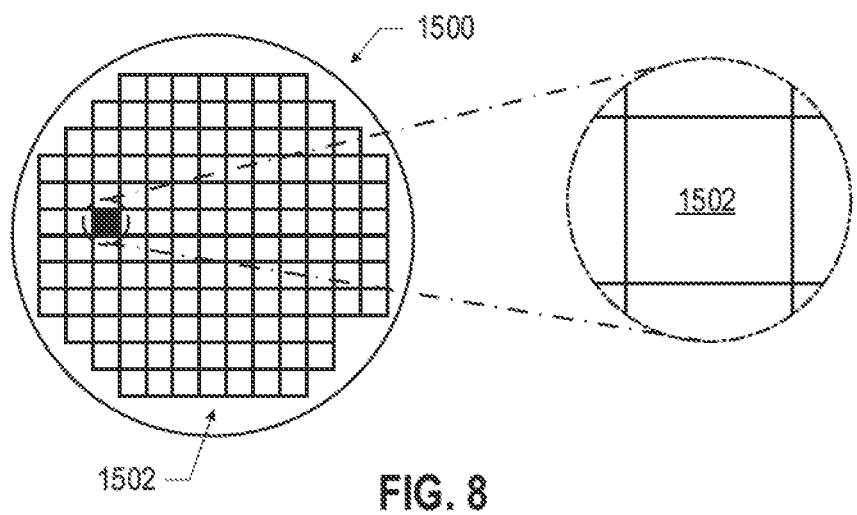
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 9:
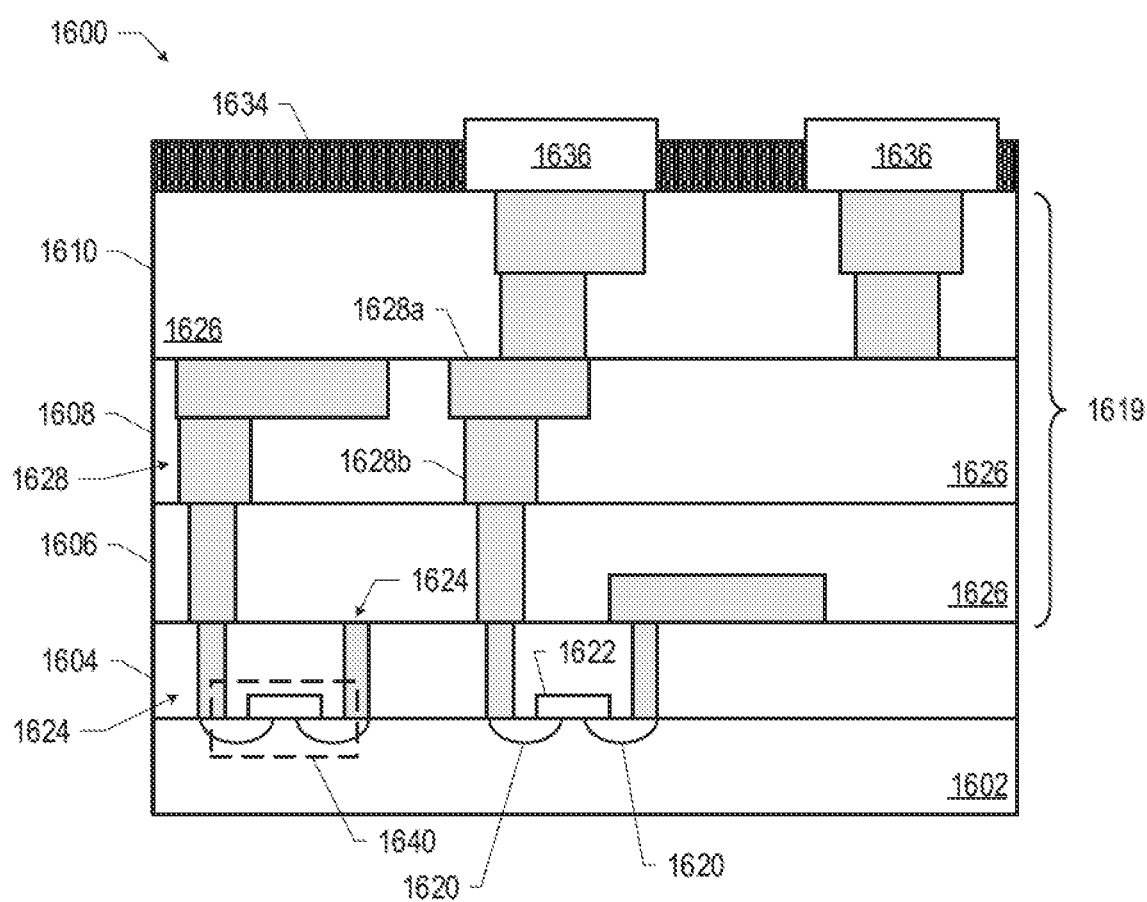
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used.

The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 9. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts 122 or 124, as appropriate.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts 122 or 124, as appropriate.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts 122 or 124, as appropriate.

Figure 10:
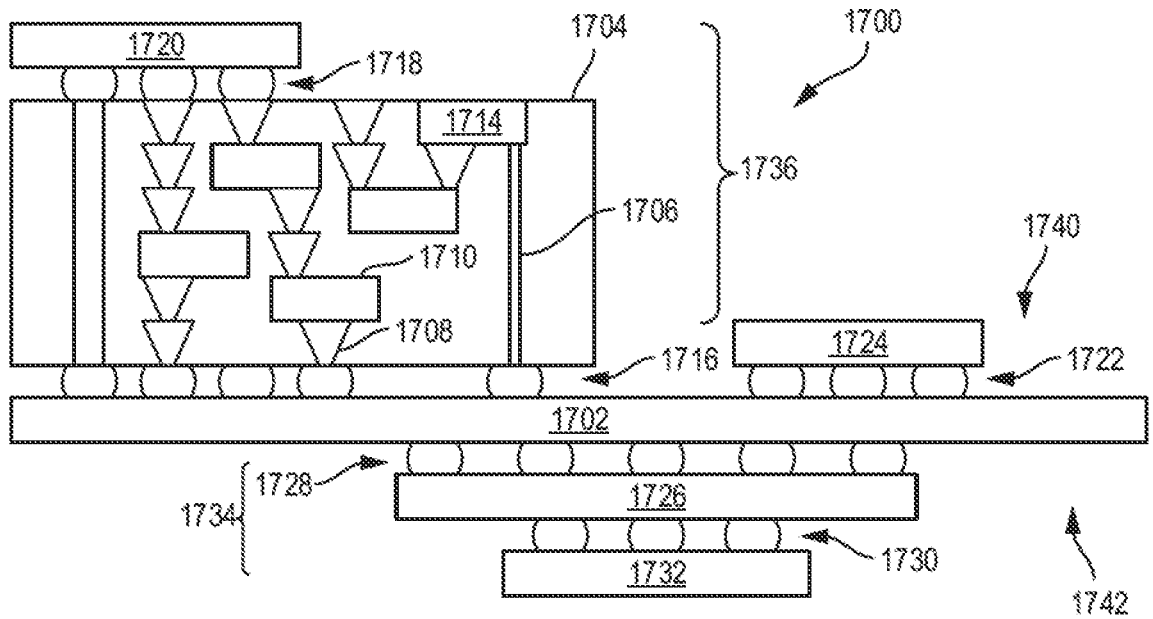
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
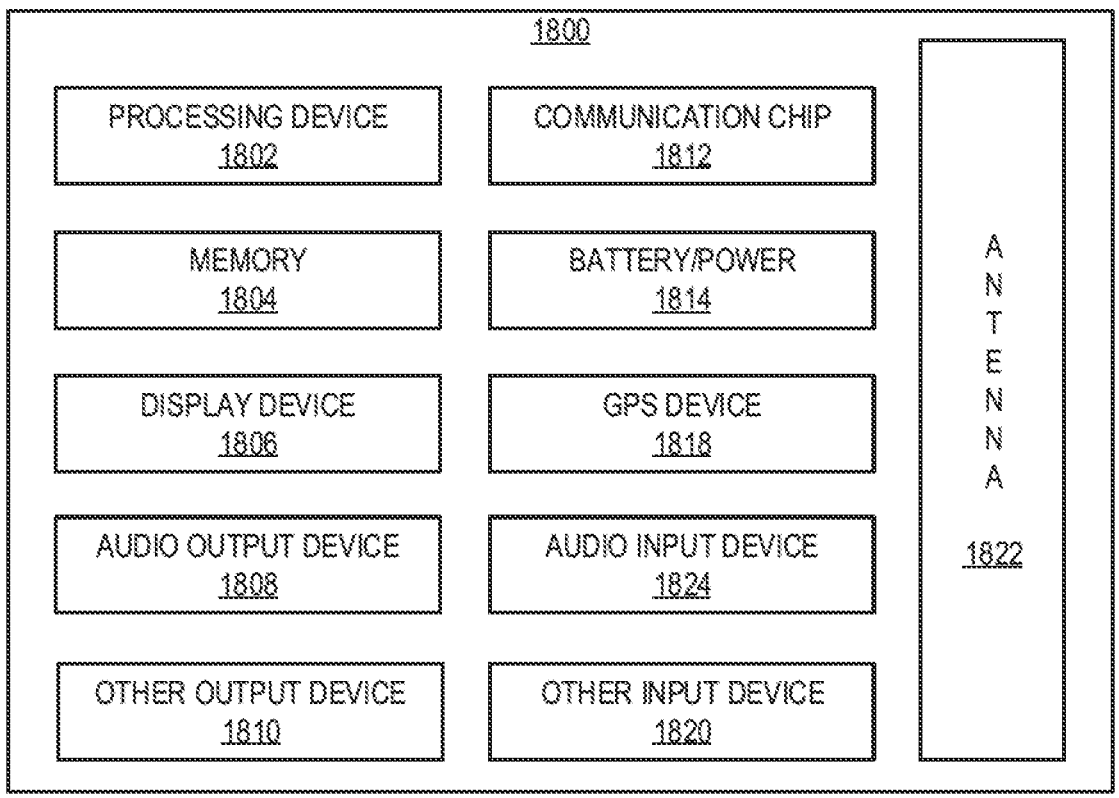
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including: a package substrate having a first surface and an opposing second surface; a first die having a first surface and an opposing second surface, wherein the first die is embedded in a first dielectric layer and wherein the first surface of the first die is coupled to the second surface of the package substrate by first interconnects; a second die having a first surface and an opposing second surface, wherein the second die is embedded in a second dielectric layer and wherein the first surface of the second die is coupled to the second surface of the first die by second interconnects; and a third die having a first surface and an opposing second surface, wherein the third die is embedded in a third dielectric layer and wherein the first surface of the third die is coupled to the second surface of the second die by third interconnects.

Example 2 may include the subject matter of Example 1, and may further specify that the first surface of the second die is coupled to the second surface of the package substrate by fourth interconnects.

Example 3 may include the subject matter of Example 2, and may further specify that the fourth interconnects include a conductive pillar.

Example 4 may include the subject matter of Example 3, and may further specify that an individual conductive pillar has a diameter between 50 microns and 400 microns.

Example 5 may include the subject matter of Example 1, and may further specify that the first surface of the third die is coupled to the second surface of the package substrate by fifth interconnects.

Example 6 may include the subject matter of Example 5, and may further specify that the fifth interconnects include a conductive pillar.

Example 7 may include the subject matter of Example 6, and may further specify that an individual conductive pillar has a diameter between 50 microns and 400 microns.

Example 8 may include the subject matter of Example 1, and may further specify that the first surface of the third die is coupled to the second surface of the first die by sixth interconnects.

Example 9 may include the subject matter of Example 8, and may further specify that the sixth interconnects include a conductive pillar.

Example 10 may include the subject matter of Example 9, and may further specify that an individual conductive pillar has a diameter between 10 microns and 300 microns.

Example 11 may include the subject matter of Example 1, and may further include: a fourth die having a first surface and an opposing second surface, wherein the fourth die is embedded in the first dielectric layer, wherein the first surface of the fourth die is coupled to the second surface of the package substrate by seventh interconnects, and wherein the second surface of the fourth die is coupled to the first surface of the second die by eighth interconnects.

Example 12 may include the subject matter of Example 11, and may further specify that a pitch of the second interconnects is different from a pitch of the eighth interconnects.

Example 13 may include the subject matter of Example 1, and may further include: a fifth die having a first surface and an opposing second surface, wherein the fifth die is embedded in the third dielectric layer, and wherein the first surface of the fifth die is coupled to the second surface of the second die by ninth interconnects.

Example 14 may include the subject matter of Example 13, and may further specify that a pitch of the third interconnects is different from a pitch of the ninth interconnects.

Example 15 may include the subject matter of Example 13, and may further specify that a thickness of the third die is different from a thickness of the fifth die.

Example 16 may include the subject matter of Example 1, and may further include: a sixth die having a first surface and an opposing second surface, wherein the sixth die is embedded in a fourth dielectric layer, wherein the first surface of the sixth die is coupled to the second surface of the third die by tenth interconnects.

Example 17 may include the subject matter of Example 1, and may further include: a redistribution layer between the first dielectric layer and the second dielectric layer, or between the second dielectric layer and the third dielectric layer.

Example 18 may include the subject matter of Example 1, and may further specify that a pitch of the first interconnects is different from a pitch of the second interconnects.

Example 19 may include the subject matter of Example 1, and may further specify that a pitch of the second interconnects is different from a pitch of the third interconnects.

Example 20 may include the subject matter of Example 1, and may further specify that the first interconnects have a pitch between 200 microns and 800 microns.

Example 21 may include the subject matter of Example 1, and may further specify that the second interconnects have a pitch between 5 microns and 100 microns.

Example 22 may include the subject matter of Example 1, and may further specify that the third interconnects have a pitch between 5 microns and 100 microns.

Example 23 may include the subject matter of Example 1, and may further specify that the second die overlaps the first die by a distance between 0.5 millimeters and 5 millimeters.

Example 24 may include the subject matter of Example 1, and may further specify that the third die overlaps the second die by a distance between 0.5 millimeters and 5 millimeters.

Example 25 may include the subject matter of Example 1, and may further specify that the first interconnects, the second interconnects, or the third interconnects include solder.

Example 26 may include the subject matter of Example 1, and may further specify that the first interconnects, the second interconnects, or the third interconnects include an anisotropic conductive material.

Example 27 may include the subject matter of Example 1, and may further specify that the first interconnects, the second interconnects, or the third interconnects include plated interconnects.

Example 28 may include the subject matter of Example 1, and may further specify that the first interconnects, the second interconnects, or the third interconnects include an underfill material.

Example 29 may include the subject matter of Example 1, and may further specify that the first die is a double-sided die.

Example 30 may include the subject matter of Example 1, and may further specify that the second die is a double-sided die.

Example 31 may include the subject matter of Example 1, and may further specify that the third die is a double-sided die.

Example 32 may include the subject matter of Example 1, and may further specify that the third die is a single-sided die.

Example 33 may include the subject matter of Example 1, and may further specify that the first die or the third die is a central processing unit.

Example 34 may include the subject matter of Example 1, and may further specify that the second die includes a memory device.

Example 35 may include the subject matter of Example 1, and may further specify that the second die is a high bandwidth memory device.

Example 36 may include the subject matter of Example 1, and may further specify that the package substrate is a printed circuit board.

Example 37 may include the subject matter of Example 1, and may further specify that the microelectronic assembly is included in a server device.

Example 38 may include the subject matter of Example 1, and may further specify that the microelectronic assembly is included in a portable computing device.

Example 39 may include the subject matter of Example 1, and may further specify that the microelectronic assembly included in a wearable computing device.

Example 40 is a computing device, including: a microelectronic assembly, including: a package substrate having a first surface and an opposing second surface; a first die having a first surface and an opposing second surface, wherein the first die is embedded in a first dielectric layer and wherein the first surface of the first die is coupled to the second surface of the package substrate by first interconnects; a second die having a first surface and an opposing second surface, wherein the second die is embedded in a second dielectric layer and wherein the first surface of the second die is coupled to the second surface of the first die by second interconnects; and a third die having a first surface and an opposing second surface, wherein the third die is embedded in a third dielectric layer and wherein the first surface of the third die is coupled to the second surface of the second die by third interconnects.

Example 41 may include the subject matter of Example 40, and may further specify that the first surface of the second die is coupled to the second surface of the package substrate by fourth interconnects.

Example 42 may include the subject matter of Example 41, and may further specify that the fourth interconnects include a conductive pillar.

Example 43 may include the subject matter of Example 42, and may further specify that an individual conductive pillar has a diameter between 50 microns and 400 microns.

Example 44 may include the subject matter of Example 40, and may further specify that the first surface of the third die is coupled to the second surface of the package substrate by fifth interconnects.

Example 45 may include the subject matter of Example 44, and may further specify that the fifth interconnects include a conductive pillar.

Example 46 may include the subject matter of Example 45, and may further specify that an individual conductive pillar has a diameter between 50 microns and 400 microns.

Example 47 may include the subject matter of Example 40, and may further specify that the first surface of the third die is coupled to the second surface of the first die by sixth interconnects.

Example 48 may include the subject matter of Example 47, and may further specify that the sixth interconnects include a conductive pillar.

Example 49 may include the subject matter of Example 48, and may further specify that an individual conductive pillar has a diameter between 10 microns and 300 microns.

Example 50 may include the subject matter of Example 40, and may further include: a redistribution layer between the first dielectric layer and the second dielectric layer, or between the second dielectric layer and the third dielectric layer.

Example 51 may include the subject matter of Example 40, and may further specify that a pitch of the first interconnects is different from a pitch of the second interconnects.

Example 52 may include the subject matter of Example 40, and may further specify that a pitch of the second interconnects is different from a pitch of the third interconnects.

Example 53 may include the subject matter of Example 40, and may further specify that the first interconnects have a pitch between 200 microns and 800 microns.

Example 54 may include the subject matter of Example 40, and may further specify that the second interconnects have a pitch between 5 microns and 100 microns.

Example 55 may include the subject matter of Example 40, and may further specify that the third interconnects have a pitch between 5 microns and 100 microns.

Example 56 is a microelectronic assembly, including: a first die having a first surface and an opposing second surface, wherein the first die is embedded in a first dielectric layer; a second die having a first surface and an opposing second surface, wherein the second die is embedded in a second dielectric layer and wherein the first surface of the second die is coupled to the second surface of the first die by first interconnects; and a third die having a first surface and an opposing second surface, wherein the third die is embedded in a third dielectric layer, and wherein the first surface of the third die is coupled to the second surface of the first die by second interconnects, wherein the second interconnects include a conductive pillar.

Example 57 may include the subject matter of Example 56, and may further specify that an individual conductive pillar has a diameter between 10 microns and 300 microns.

Example 58 may include the subject matter of Example 56, and may further specify that a pitch of the first interconnects is different from a pitch of the second interconnects.

Example 59 may include the subject matter of Example 56, and may further specify that the first interconnects have a pitch between 5 microns and 100 microns.

Example 60 may include the subject matter of Example 56, and may further specify that the second interconnects have a pitch between 200 microns and 800 microns.

Example 61 may include the subject matter of Example 56, and may further include: a redistribution layer between the first dielectric layer and the second dielectric layer, or between the second dielectric layer and the third dielectric layer.

Example 62 may include the subject matter of Example 56, and may further include: a fourth die having a surface, wherein the fourth die is embedded in a fourth dielectric layer and wherein the surface of the fourth die is coupled to the second surface of the second die or to the second surface of the first die by third interconnects, and wherein the third interconnects include a conductive pillar.

Example 63 is a method of manufacturing a microelectronic assembly, including: forming first interconnects between a first die and a second die, wherein the first die has a first surface with first conductive contacts and an opposing second surface with second conductive contacts, the first die, wherein the second die has a first surface with first conductive contacts and an opposing second surface with second conductive contacts, and wherein the first interconnects couple the second conductive contacts of the first die to the first conductive contacts of the second die; forming second interconnects between the second die and a third die, wherein the third die has a first surface with conductive contacts and an opposing second surface, and wherein the second interconnects couple the second conductive contacts of the second die to the conductive contacts of the third die; and forming third interconnects between the first die and the third die, wherein the third interconnects couple the conductive contacts of the third die to the second conductive contacts of the first die.

Example 64 may include the subject matter of Example 63, and may further specify that the third interconnects include a conductive pillar.

Example 65 may include the subject matter of Example 64, and may further specify that the conductive pillar is formed by depositing and patterning a photoresist material to form one or more openings, depositing conductive material in the one or more openings, and removing the photoresist material.

Example 66 may include the subject matter of Example 63, and may further specify that the first interconnects or the second interconnects do not include solder.

Example 67 may include the subject matter of Example 63, and may further specify that the first interconnects or the second interconnects are metal-to-metal interconnects.

Example 68 may include the subject matter of Example 63, and may further specify that the first interconnects or the second interconnects include an anisotropic conductive material.

Example 69 may include the subject matter of Example 63, and may further specify that a pitch of the first interconnects is different than a pitch of the second interconnects.

Example 70 may include the subject matter of Example 63, and may further specify that a pitch of the second interconnects is different than a pitch of the third interconnects.

Example 71 may include the subject matter of Example 63, and may further include: forming a redistribution layer between the first die and the second die or between the second die and the third die.

Example 72 may include the subject matter of Example 63, and may further include: forming fourth interconnects between the first die and a package substrate, wherein the fourth interconnects couple the first conductive contacts on the first die to conductive contacts on a surface of the package substrate.

The invention claimed is:

1. A microelectronic assembly, comprising:
   a package substrate;
   a first insulating material layer above the package substrate, the first insulating material layer having a first lateral width;
   a first die in the first insulating material layer, the first die having a top side opposite a bottom side, and a first sidewall and a second sidewall between the top side and the bottom side, the second sidewall laterally opposite the first sidewall;
   a first interconnect in the first insulating material layer, the first interconnect laterally spaced apart from the first sidewall of the first die;
   a second interconnect in the first insulating material layer, the second interconnect laterally spaced apart from the second sidewall of the first die;
   a redistribution layer over the first insulating material and over the first die, the redistribution layer coupled to the first interconnect, the redistribution layer coupled to the first die, the redistribution layer coupled to the second interconnect, and the redistribution layer having a second lateral width the same as the first lateral width;
   a second insulating material layer over the redistribution layer, the second insulating material layer having a third lateral width, the third lateral width the same as the second lateral width;
   a second die coupled to the redistribution layer, wherein the second insulating material layer surrounds and extends beyond the second die; and
   a third die coupled to the redistribution layer, the third die laterally spaced apart from the second die, wherein the second insulating material layer surrounds and extends beyond the third die.

2. The microelectronic assembly of claim 1, wherein the third die is thinner than the second die.

3. The microelectronic assembly of claim 1, further comprising:
   a fourth die above and coupled to the third die.

4. The microelectronic assembly of claim 1, wherein the first insulating material layer has a vertical thickness the same as a vertical thickness of the first interconnect and the second interconnect.

5. The microelectronic assembly of claim 1, wherein the first insulating material layer has a vertical thickness greater than a vertical thickness of the first interconnect and the second interconnect.

6. The microelectronic assembly of claim 1, wherein the first interconnect and the second interconnect extend below a bottom of the first die.

7. The microelectronic assembly of claim 1, further comprising a third interconnect laterally spaced apart from the first interconnect, and a fourth interconnect laterally spaced apart from the second interconnect.

8. The microelectronic assembly of claim 7, wherein the third interconnect and the first interconnect have a pitch, the fourth interconnect and the second interconnect have the pitch, and the pitch is between 100 to 300 microns.

9. A microelectronic assembly, comprising:
   a package substrate;
   a first insulating material layer above the package substrate, the first insulating material layer having a first side and a second side, the second side laterally opposite to the first side;
   a first die in the first insulating material layer;
   a first interconnect in the first insulating material layer, the first interconnect laterally spaced apart from the first die;
   a second interconnect in the first insulating material layer, the second interconnect laterally spaced apart from the first die, the first die laterally between the first interconnect and the second interconnect;
   a redistribution layer over the first insulating material and over the first die, the redistribution layer coupled to the first interconnect, the redistribution layer coupled to the first die, and the redistribution layer coupled to the second interconnect, the redistribution layer extending from the first side of the first insulating layer to the second side of the first insulating layer;
   a second insulating material layer over the redistribution layer, the second insulating material layer extending from the first side of the first insulating layer to the second side of the first insulating layer;
   a second die in the second insulating material layer, the second die coupled to the redistribution layer;
   a third die in the second insulating material layer, the third die coupled to the redistribution layer, and the third die laterally spaced apart from the second die, wherein the third die is thinner than the second die; and
   a fourth die above and coupled to the third die.

10. The microelectronic assembly of claim 9, wherein the first insulating material layer has a vertical thickness the same as a vertical thickness of the first interconnect and the second interconnect.

11. The microelectronic assembly of claim 9, wherein the first insulating material layer has a vertical thickness greater than a vertical thickness of the first interconnect and the second interconnect.

12. The microelectronic assembly of claim 9, further comprising a third interconnect laterally spaced apart from the first interconnect, and a fourth interconnect laterally spaced apart from the second interconnect, and wherein the third interconnect and the first interconnect have a pitch, the fourth interconnect and the second interconnect have the pitch, and the pitch is between 100 to 300 microns.

13. A microelectronic assembly, comprising:
   a package substrate;
   a first insulating material layer above the package substrate, the first insulating material layer having a first lateral width;

a first die in the first insulating material layer, the first die having a top side opposite a bottom side, and a first sidewall and a second sidewall between the top side and the bottom side, the second sidewall laterally opposite the first sidewall;

a first interconnect in the first insulating material layer, the first interconnect laterally spaced apart from the first sidewall of the first die;

a second interconnect in the first insulating material layer, the second interconnect laterally spaced apart from the second sidewall of the first die;

a redistribution layer over the first insulating material and over the first die, the redistribution layer coupled to the first interconnect, the redistribution layer coupled to the first die, and the redistribution layer coupled to the second interconnect;

a second insulating material layer over the redistribution layer, the second insulating material layer having a second lateral width, the second lateral width the same as the first lateral width;

a second die coupled to the redistribution layer, wherein the second insulating material layer surrounds and extends beyond the second die; and a third die coupled to the redistribution layer, the third die laterally spaced apart from the second die, wherein the second insulating material layer surrounds and extends beyond the third die, wherein the third die is thinner than the second die.

* * * * *